(12) United States Patent
Lin et al.

(10) Patent No.: US 9,704,924 B2
(45) Date of Patent: Jul. 11, 2017

(54) LIGHT EMITTING DEVICE

(71) Applicant: Industrial Technology Research Institute, Chutung, Hsinchu County (TW)

(72) Inventors: Yi-Ping Lin, Chutung (TW); Jung-Yu Li, Chutung (TW); Guan-Yu Chen, Chutung (TW); Shih-Pu Chen, Chutung (TW); Jin-Han Wu, Chutung (TW); Cheng-Chang Chen, Chutung (TW)

(73) Assignee: Industrial Technology Research Institute, Chutung (TW)

(*) Notice: Subject to any disclaimer, the term of this patent is extended or adjusted under 35 U.S.C. 154(b) by 26 days.

(21) Appl. No.: 14/755,576

(22) Filed: Jun. 30, 2015

(65) Prior Publication Data
US 2016/0268533 A1     Sep. 15, 2016

(30) Foreign Application Priority Data

Jan. 26, 2015 (TW) .............................. 104102492 A
Mar. 10, 2015 (TW) .............................. 104107524 A
Apr. 17, 2015 (TW) .............................. 104112373 A

(51) Int. Cl.
*H01L 51/52* (2006.01)
*H01L 27/32* (2006.01)
*H01L 51/50* (2006.01)

(52) U.S. Cl.
CPC ...... *H01L 27/3209* (2013.01); *H01L 27/3211* (2013.01); *H01L 51/5265* (2013.01);
(Continued)

(58) Field of Classification Search
CPC ............. H01L 51/5008; H01L 51/5056; H01L 27/3209; H01L 51/5206; H01L 51/0096;
(Continued)

(56) References Cited

U.S. PATENT DOCUMENTS 5,707,745 A * 1/1998 Forrest ................... C09K 11/06
                                                                  257/440
5,811,833 A * 9/1998 Thompson ............. B82Y 10/00
                                                                  257/103
(Continued)

FOREIGN PATENT DOCUMENTS

CN         1170383 A      1/1998
CN         1551689 A      12/2004
(Continued)

OTHER PUBLICATIONS

Feng et al., "Enhancement of electroluminescence through a two-dimensional corrugated metal film by grating induced surface-plasmon cross coupling," *Optics Letters*, 30(17):2302-2304 (2005).
(Continued)

*Primary Examiner* — Donald Raleigh
(74) *Attorney, Agent, or Firm* — McCarter & English, LLP; Yu Lu

(57) ABSTRACT

A light emitting device includes a substrate layer, first and second metal layers sequentially formed on the substrate layer, and an organic material layer formed between the first and second metal layers. The first metal layer has a uniform thickness or has metal portions or further has an open portion exposing a portion of the surface of the substrate layer. The organic material layer includes a hole transport material and an electron transport material in contact with one another. An interaction between the hole transport material and the electron transport material generates exciplexes capable of emitting light having a peak wavelength in a first range, and a coupling is generated between the first and second metal layers. By adjusting the distance between the first and second metal layers or the thickness of the first metal layer, the peak wavelength of the light is shifted to a second range and/or a third range.

33 Claims, 16 Drawing Sheets

(52) U.S. Cl.
CPC ...... *H01L 51/5044* (2013.01); *H01L 51/5206* (2013.01); *H01L 51/5221* (2013.01); *H01L 2251/558* (2013.01)

(58) Field of Classification Search
CPC ............. H01L 27/3211; H01L 51/5221; H01L 51/5072; H01L 2251/558
See application file for complete search history.

(56) References Cited

U.S. PATENT DOCUMENTS

| | | | |
|---|---|---|---|
| 6,528,188 B1* | 3/2003 | Suzuki | H01L 51/5036 313/502 |
| 6,670,772 B1 | 12/2003 | Arnold et al. | |
| 7,247,394 B2 | 7/2007 | Hatwar et al. | |
| 8,134,291 B2 | 3/2012 | Lee et al. | |
| 8,269,214 B2 | 9/2012 | Smigelski, Jr. et al. | |
| 8,304,796 B2 | 11/2012 | Fukuda | |
| 8,415,875 B2 | 4/2013 | Smith et al. | |
| 8,618,729 B2 | 12/2013 | Frischeisen et al. | |
| 2003/0030370 A1* | 2/2003 | Tada | H01L 27/3211 313/504 |
| 2005/0280008 A1* | 12/2005 | Ricks | C09K 11/06 257/79 |
| 2008/0272690 A1* | 11/2008 | Kuma | H01L 51/5036 313/504 |
| 2009/0170230 A1* | 7/2009 | Kidu | H01L 27/3211 438/35 |
| 2011/0151605 A1 | 6/2011 | Yoon | |
| 2012/0032138 A1 | 2/2012 | Kim et al. | |
| 2012/0235197 A1 | 9/2012 | Okuyama | |
| 2014/0183464 A1* | 7/2014 | Baek | H01L 27/3213 257/40 |
| 2015/0236290 A1 | 8/2015 | Li et al. | |
| 2015/0243931 A1* | 8/2015 | Fukuura | H01L 51/5268 257/98 |
| 2016/0049608 A1* | 2/2016 | Hack | H01L 51/56 257/40 |
| 2016/0218313 A1 | 7/2016 | Lin et al. | |

FOREIGN PATENT DOCUMENTS

| | | | |
|---|---|---|---|
| CN | 1939096 A | 3/2007 | |
| CN | 102104101 A | 6/2011 | |
| CN | 102956838 A | 3/2013 | |
| CN | 103904100 A | 7/2014 | |
| TW | 200402011 A | 2/2004 | |
| TW | 200519413 | 6/2005 | |
| TW | I304707 | 12/2008 | |
| TW | 201234583 A | 8/2012 | |
| TW | I401818 B | 7/2013 | |
| TW | I406587 B | 8/2013 | |
| TW | 201403901 A | 1/2014 | |
| TW | 201419521 A | 5/2014 | |
| TW | 201431853 A | 8/2014 | |
| TW | 201436334 A | 9/2014 | |
| TW | 201444077 A | 11/2014 | |
| TW | 201533944 A | 9/2015 | |
| WO | WO-2013099875 A1 | 7/2013 | |
| WO | 2014119385 A1 | 8/2014 | |

OTHER PUBLICATIONS

Koller et al., "Surface plasmon coupled electroluminescent emission," *Applied Physics Letters*, 92:103304-1-103304-3 (2008).
Koo et al., "Light extraction from organic light-emitting diodes enhanced by spontaneously formed buckles," *Nature Photonics*, 4:222-226 (2010).
Wedge et al., "Surface plasmon polariton mediated emission of light from top-emitting organic light-emitting diode type structures," *Organic Electronics*, 8:136-147 (2007).
Yates et al., "Surface plasmon-polariton mediated emission from phosphorescent dendrimer light-emitting diodes," *Applied Physics Letters*, 88:161105:1-161105-3 (2006).
CN102104101 English abstract.
CN1551689(A) English abstract.
TW200519413 English abstract.
TW201403901(A) English abstract.
CN 102956838 English Abstract.
TW I304707 English Abstract.
TW I406587 English Abstract.
TW 201419521 English Abstract.
TW 201431853 English Abstract.
TW 201436334 English Abstract.
TW 201444077 English Abstract.
Office Action issued Apr. 11, 2016 in TW 10520429440.
Office Action issued Oct. 14, 2016 in TW 1052125360.
TW200402011 English Abstract.
TW201234583 English Abstract.
TW201533944 English Abstract.
TWI401818 English Abstract.
U.S. Appl. No. 15/099,771 Notice of Allowance Dated Apr. 12, 2017.
CN1170383 English abstract.
CN1939096 English abstract.
CN103904100 English abstract.
WO2014119385 English abstract.
CN201510371761.2 Office Action dated Mar. 28, 2017.
CN201510371554.7 Office Action dated Mar. 28, 2017.

* cited by examiner

LIGHT EMITTING DEVICE

CROSS-REFERENCE TO RELATED APPLICATIONS

This application claims foreign priority under 35 U.S.C. §119(a) to Patent Application No. 104102492, filed on Jan. 26, 2015, Application No. 104107524, filed on Mar. 10, 2015, and Application No. 104112373, filed on Apr. 17, 2015, all in the Intellectual Property Office of Ministry of Economic Affairs, Republic of China (Taiwan, R.O.C.), the entire contents of each of the foregoing Patent Applications are incorporated herein by reference.

BACKGROUND OF THE INVENTION

1. Technical Field

The present disclosure relates to light emitting devices, and, more particularly, to an organic light emitting device.

2. Description of Related Art

Generally, an LED (Light Emitting Diode) consists of a semiconductor material doped with impurities to form p-type and n-type semiconductors. The p-type and n-type semiconductors are further combined to form a pn junction. Holes and electrons can be injected from the p-type and n-type semiconductors, respectively. When injected holes and electrons recombine at the pn junction, energy is released in the form of photons.

In particular, an OLED (Organic Light Emitting Diode) uses an organic material. The OLED operates as follows. When a forward biased voltage is applied to the OLED, electrons and holes are injected from a cathode and an anode, respectively, and excitons are formed in a light emitting layer through recombination of electrons and holes. Radiative decay of the excitons results in light emission. Further, the light emitting layer is doped with a fluorescent or phosphorescent light-emitting guest material to improve the luminous efficiency and prolong the lifetime of the OLED.

In recent years, a great progress has been made on the luminous efficiency and lifetime of red, green and blue light emitting materials of OLEDs, especially green light emitting materials. However, blue light emitting materials show a relatively inferior performance in comparison with green or red light emitting materials. Although blue phosphorescent materials have a luminous efficiency of about 20.4 cd/A, they have a short lifetime of several hundred hours.

Therefore, there is a need to develop high-efficient OLEDs that can overcome the above-described drawbacks by, for example, dispensing with blue fluorescent/phosphorescent light-emitting guest materials.

SUMMARY OF THE INVENTION

According to one embodiment, a light emitting device is provided, which comprises: a substrate layer; a first metal layer formed on the substrate layer; a second metal layer formed above the first metal layer; and an organic material layer formed between the first metal layer and the second metal layer and comprising a hole transport material and an electron transport material in contact with one another; wherein an interaction between the hole transport material and the electron transport material generates exciplexes capable of emitting light having a peak wavelength within a first range, and a coupling is generated between the first metal layer and the second metal layer to shift the peak wavelength of the light, a distance between the first metal layer and the second metal layer or a thickness of the first metal layer being adjusted to shift the peak wavelength of the light to a second range or a third range.

According to another embodiment, a light emitting device is provided, which comprises: a substrate layer having a surface; a first metal layer formed on the surface of the substrate layer, wherein the first metal layer has a first metal portion, a second metal portion, and an open portion formed between the first metal portion and the second metal portion and exposing a portion of the surface of the substrate layer; a second metal layer formed above the first metal layer; and an organic material layer formed between the first metal layer and the second metal layer and covering the first metal portion, the second metal portion and the exposed portion of the surface of the substrate layer, wherein the organic material layer comprises a hole transport material and an electron transport material in contact with one another; wherein an interaction between the hole transport material and the electron transport material generates exciplexes capable of emitting light having a peak wavelength within a first range, a first coupling is generated between the first metal portion and the second metal layer to shift the peak wavelength of the light from the first range to a second range, and a second coupling is generated between the second metal portion and the second metal layer to shift the peak wavelength of the light from the first range to a third range.

According to an alternative embodiment, a light emitting device id provided, which comprises: a substrate layer; a first metal layer formed on the substrate layer; a second metal layer formed above the first metal layer; a third metal layer formed above the second metal layer; a fourth metal layer formed above the third metal layer; a first organic material layer formed between the first metal layer and the second metal layer; a second organic material layer formed between the second metal layer and the third metal layer; and a third organic material layer formed between the third metal layer and the fourth metal layer; wherein each of the first organic material layer, the second organic material layer and the third organic material layer comprises a hole transport material and an electron transport material in contact with one another, allowing the hole transport material and the electron transport material to interact with one another to generate exciplexes capable of emitting light having a peak wavelength in a first range, and first light emitted by the first organic material, second light emitted by the second organic material and third light emitted by the third organic material have their peak wavelengths within the first range, a second coupling is generated between the second metal layer and the third metal layer and shifts the peak wavelength of the second light from the first range to a second range, and a third coupling is generated between the third metal layer and the fourth metal layer and shifts the peak wavelength of the third light from the first range to a third range.

According to a further embodiment, a light emitting device is provided, which has a plurality of pixels, each of the pixels comprising: a substrate layer having a surface; a first metal layer formed on the substrate layer; a second metal layer formed above the first metal layer; and an organic material layer formed between the first metal layer and the second metal layer and having a hole transport material and an electron transport material in contact with one another, the hole transport material interacting with the electron transport material to generate exciplexes that emit light having a peak wavelength within a first range, the first metal layer coupling with the second metal layer that is spaced apart from the first metal layer by the organic material layer to shift the peak wavelength, wherein each of the pixels further has one of the following structures: the first metal layer covers the surface of the substrate layer completely, the peak wavelength of the light is shifted from the first range to the second range by adjusting a thickness of the first metal layer to be less or a distance between the first metal layer and the second metal layer to be greater, or the peak wavelength of the light is shifted from the first range to the third range by adjusting the thickness of the first metal layer to be greater or the distance between the first metal layer and the second metal layer to be less; the first metal layer has a metal portion that covers a portion of the surface of the substrate layer and an open portion that exposes a remaining portion of the surface of the substrate layer, the peak wavelength of the light is shifted from the first range to the second range by adjusting a thickness of the metal portion to be less or a distance between the metal portion and the second metal layer to be greater, or the peak wavelength of the light is shifted from the first range to the third range by adjusting the thickness of the metal portion to be greater or the distance between the metal portion and the second metal layer to be less; the first metal layer has a first metal portion and a second metal portion that covers the surface, the peak wavelength of the light is shifted from the first range to the second range by adjusting a thickness of the first metal portion to be less or a distance between the first metal portion and the second metal layer to be greater, or the peak wavelength of the light is shifted from the first range to the third range by adjusting the thickness of the second metal portion to be greater or a distance between the second metal portion and the second metal layer to be less; and the first metal layer has a first metal portion, a second metal portion, and an open portion formed between the first metal portion and the second metal portion, the peak wavelength of the light is shifted from the first range to the second range by adjusting the thickness of the first metal portion to be less or the distance between the first metal portion and the second metal layer to be greater, or the peak wavelength of the light is shifted from the first range to the third range by adjusting the thickness of the second metal portion to be greater or the distance between the second metal portion and the second metal layer to be less.

DETAILED DESCRIPTION OF THE INVENTION

Figure 1A:
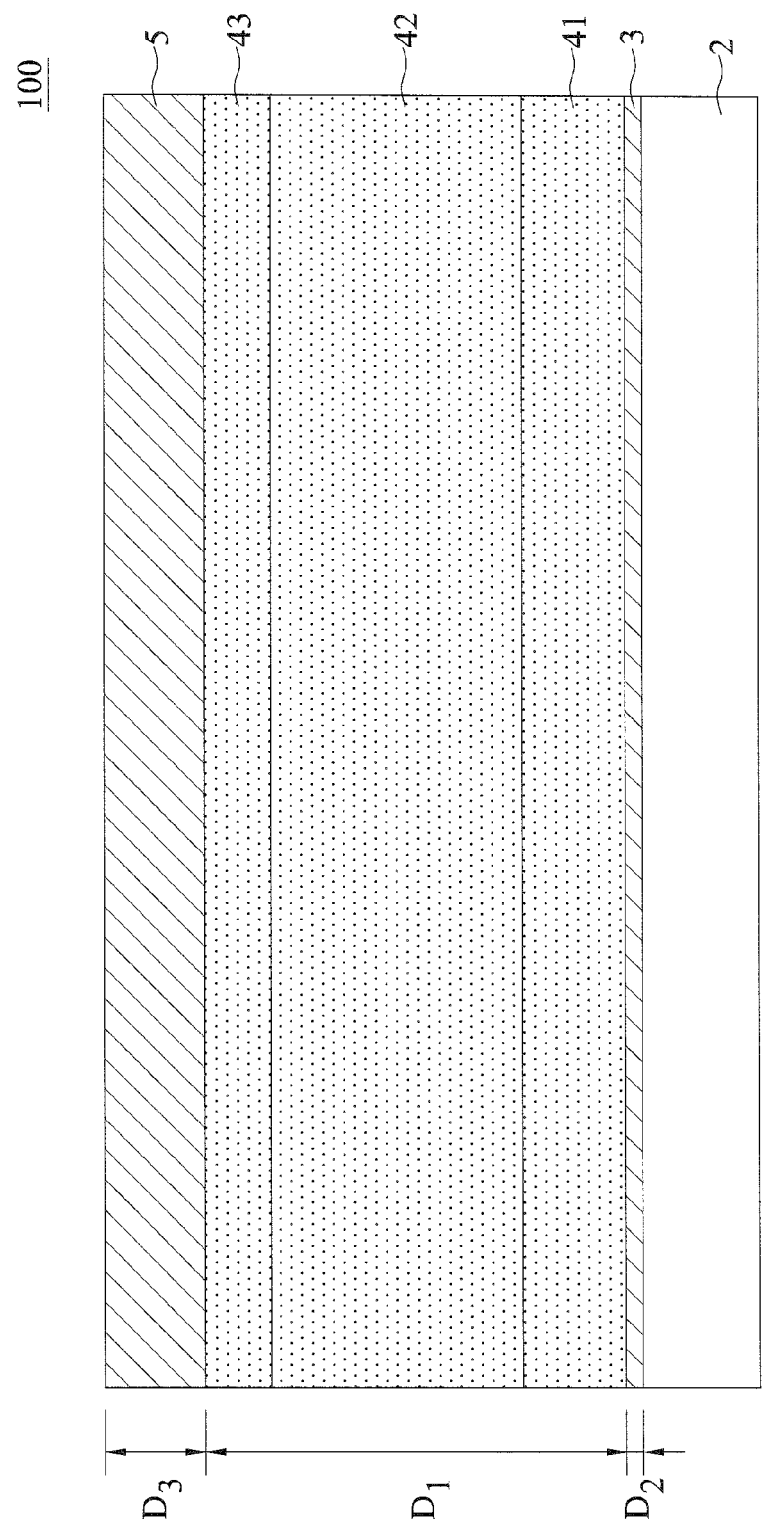
FIGS. 1A and 1B are schematic diagrams of a light emitting device according to a first embodiment of the present disclosure.

In the following detailed description, for purposes of explanation, numerous specific details are set forth in order to provide a through understanding of the disclosed embodiments. It will be apparent, however, that one or more embodiments may be practiced without these specific details. In other instances, well-known structures and devices are schematically shown in order to simplify the drawing.

Figure 1B:
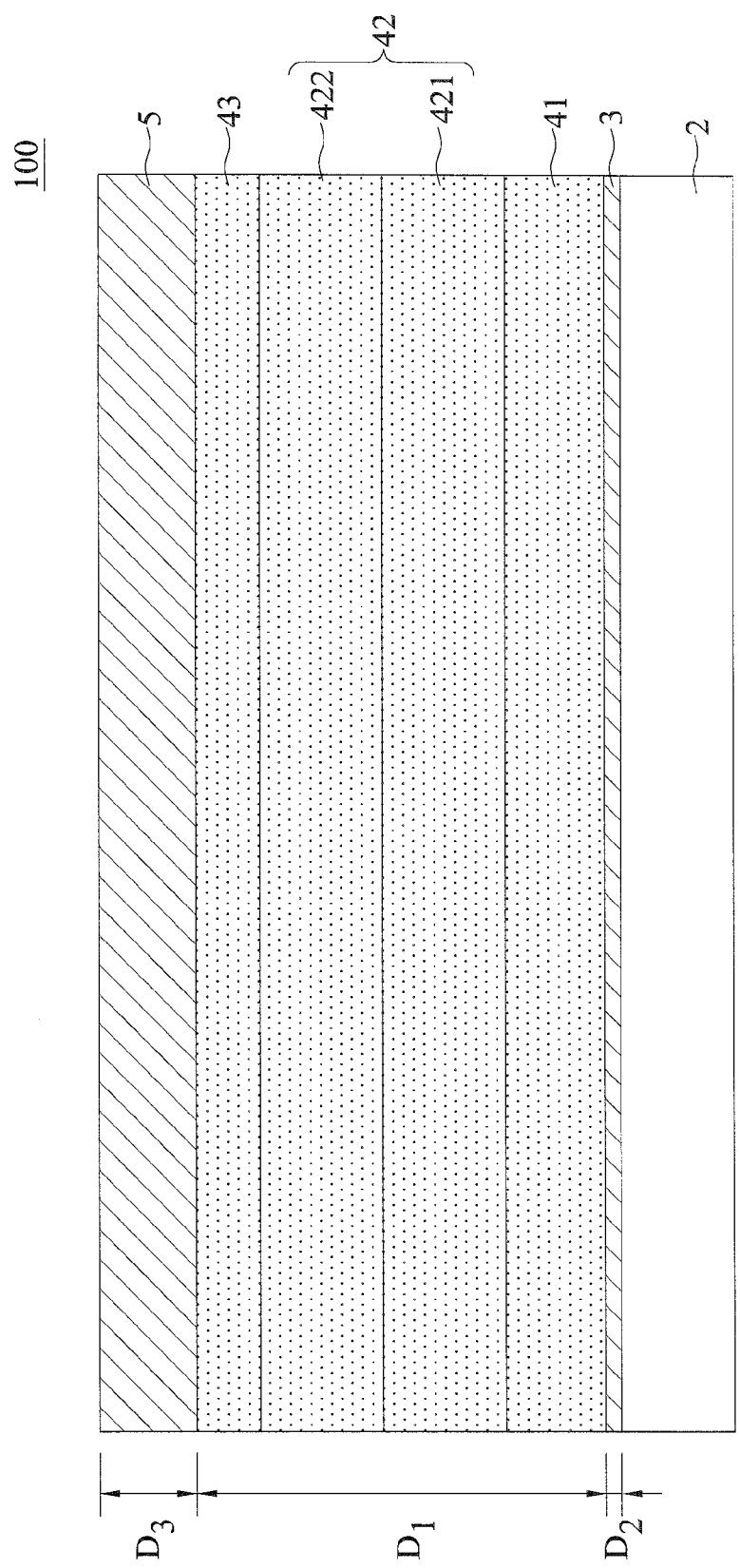

FIGS. 1A and 1B are schematic diagrams of a light emitting device 100 according to a first embodiment of the present disclosure. Referring to FIGS. 1A and 1B, the light emitting device 100 has a substrate layer 2, a first metal layer 3, a carrier injection/transfer layer 41, an organic material layer 42, a carrier injection/transfer layer 43, and a second metal layer 5 sequentially stacked on one another.

The substrate layer 2 is made of glass, plastic, or conductive metal oxide such as ITO (Indium Tin Oxide) or IZO (Indium Zinc Oxide). The substrate layer 2, if being ITO or IZO, serves as an anode.

In the present embodiment, the first metal layer 3 is formed on and completely covers the substrate layer 2. The first metal layer 3 is made of metal, for example, Al, Ag, Au, or an alloy thereof such as Al/LiF, Ag/Al/Ag or Ag/Ge/Ag, or nano metal oxide such as $BCP/V_2O_5$, $MoO_3$, $ZnS/Ag/ZnO/Ag$ or $ZnPc/C_{60}$. Further, the first metal layer 3 can include nano metal traces. In an embodiment, the first metal layer 3 is an electrode, such as an anode or a cathode. In addition, referring to FIGS. 1A and 1B, the first metal layer 3 has a thickness $D_2$ of 5 to 20 n.

The carrier injection/transfer layer 41 is formed on the first metal layer 3. When the substrate layer 2 or the first metal layer 3 acts as an anode, and the second metal layer 5 acts as a cathode, the carrier injection/transfer layer 41 acts as a hole injection/transfer layer. On the contrary, when the substrate layer 2 or the first metal layer 3 acts as a cathode, and the second metal layer 5 acts as an anode, the carrier injection/transfer layer 41 acts as an electron injection/transfer layer.

The organic material layer 42 is formed on the carrier injection/transfer layer 41 and includes a hole transport material and an electron transport material in contact with one another. Referring to FIG. 1A, the organic material layer 42 is a composite layer constituted by a combination of the hole transport material and the electron transport material. Referring to FIG. 1B, the organic material layer 42 includes a hole transport sublayer 421 made of the hole transport material and an electron transport sublayer 422 formed on and in contact with the hole transport sublayer 421 and made of the electron transport material. When the carrier injection/transfer layer 41 is a hole injection/transfer layer, the hole transport sublayer 421 is adjacent to the carrier injection/transfer layer (i.e., adjacent to the first metal layer 3), and the electron transport sublayer 422 is adjacent to the carrier injection/transfer layer 43 that acts as an electrode injection layer (i.e., adjacent to the second metal layer 5).

In the present embodiment, the hole transport material is, for example, 1,3-bis(N-carbazolyl)benzene (mCP), 4,49,40-tri(N-carbazolyl)triphenylamine (TCTA), 9,9-di[4-(di-p- tolyl)aminophenyl]fluorine (DTAF), 1,1-bis[(di-4-tolylamino)phenyl]cyclohexane (TAPC) or N,N'-diphenyl-N,N'-di-[4-(N,N-diphenyl-amino)phenyl]benzidine (NPNPB). The structural formulas of mCP, TCTA, DTAF, TAPC and NPNPB are shown as follows.

Formula 1

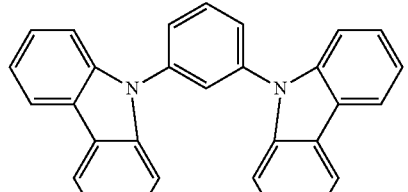

mCP

Formula 2

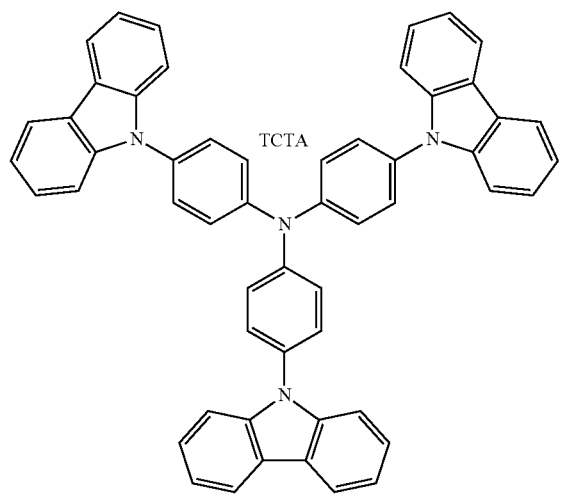

TCTA

Formula 3

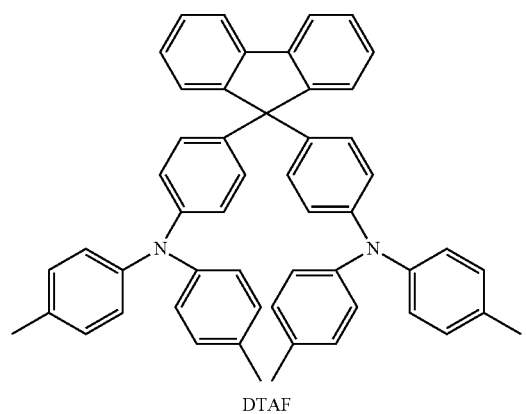

DTAF

-continued

Formula 4

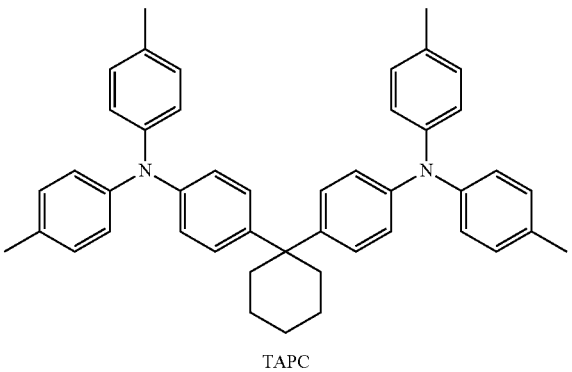

TAPC

Formula 5

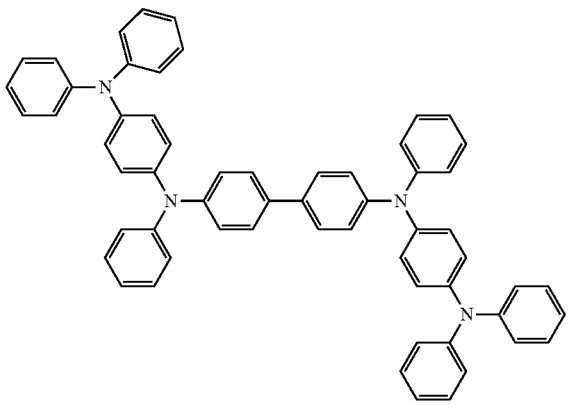

NPNPB

The electron transport material is, for example, PO-T2T or 4,6-bis(3,5-di(pyridin-3-yl)phenyl)-2-methylpyrimidine (B3PYMPM). The structural formulas of PO-T2T and B3PYMPM are shown as follows.

Formula 6

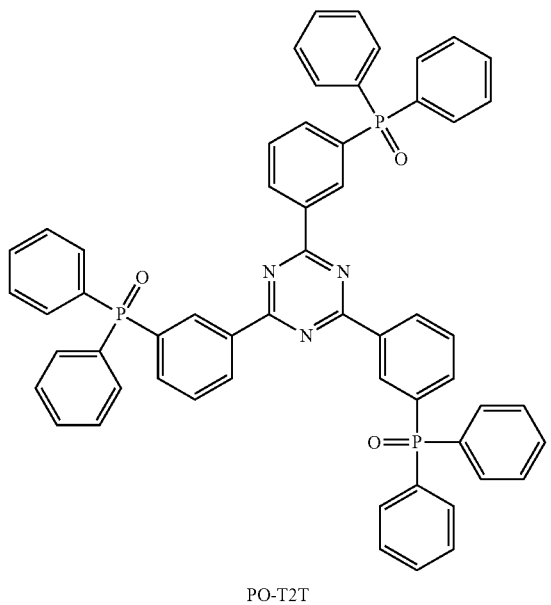

PO-T2T

-continued

Formula 7

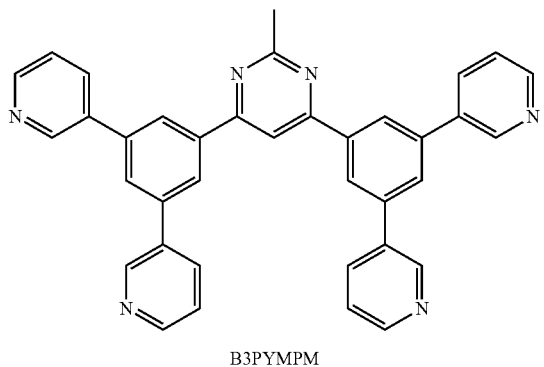

B3PYMPM

The hole transport material and the electron transport material interact with one another to generate exciplexes. The electron transport material of PO-T2T in combination with different hole transport materials generate exciplexes capable emitting light of various colors. For example, a combination of PO-T2T and mCP can emit blue light having a peak wavelength of 380 to 495 nm. A combination of PO-T2T and TCTA can emit green light having a peak wavelength of 495 to 570 nm. A combination of PO-T2T and DTAF can emit yellow light having a peak wavelength of 570 to 590 nm. A combination of PO-T2T and TAPC can emit orange light having a peak wavelength of 590 to 620 nm. A combination of PO-T2T and NPNPB can emit red light having a peak wavelength of 570 to 750 nm.

The carrier injection/transfer layer 43 is formed on the organic material layer 42. When the substrate layer 2 or the first metal layer 3 acts as an anode, and the second metal layer 5 acts as a cathode, the carrier injection/transfer layer 43 acts as an electron injection/transfer layer. On the contrary, when the substrate layer 2 or the first metal layer 3 acts as a cathode, and the second metal layer 5 acts as an anode, the carrier injection/transfer layer 43 acts as a hole injection/transfer layer. Further, referring to FIGS. 1A and 1B, the carrier injection/transfer layer 41, the organic material layer 42 and the carrier injection/transfer layer 43 have a total thickness $D_1$ of 75 to 150 nm. The distance $D_1$ between the first metal layer 3 and the second metal layer 5 is changed by adjusting the thickness of one of the carrier injection/transfer layer 41, the organic material layer 42 and the carrier injection/transfer layer 43.

The second metal layer 5 is formed on the carrier injection/transfer layer 43, and the organic material layer 42 is sandwiched between the first metal layer 3 and the second metal layer 5. As such, a distance $D_1$ is formed between the first metal layer 3 and the second metal layer 5. The second metal layer 5 is made of metal, for example, Al, Ag, Au, or an alloy thereof such as Al/LiF, Ag/Al/Ag or Ag/Ge/Ag, or nano metal oxide such as $BCP/V_2O_5$, $MoO_3$, $ZnS/Ag/ZnO/Ag$ and $ZnPc/C_{60}$. The second metal layer 5 generally serves as a cathode. In addition, referring to FIGS. 1A and 1B, the second metal layer 5 has a thickness $D_3$ above 20 nm.

When a voltage is applied across the second metal layer 5 and the first metal layer 3 or the substrate layer 2, through an interaction between the hole transport material and the electron transport material in the organic material layer, exciplexes that can emit light are generated. Further, a coupling (i.e., a plasmon coupling effect) between the first metal layer 3 and the second metal layer 5 can cause the peak wavelength of the light emitted by the exciplexes to shift toward, for example, a longer wavelength (red shift) or a shorter wavelength (blue shift). Therefore, by adjusting the distance $D_1$ between the first metal layer 3 and the second metal layer 5 or the thickness $D_2$ of the first metal layer 3, the peak wavelength of the light emitted from the organic material layer 42 can be red-shifted or blue-shifted to a new wavelength. For example, the light emitted from the organic material layer 42 can be red-shifted from a wavelength of green light (having a peak wavelength of 495 to 570 nm) to a wavelength of red light (having a peak wavelength of 570 to 750 nm), or red-shifted from a wavelength of red light (having a peak wavelength of 570 to 750 nm) to a wavelength of near infrared light (having a peak wavelength less than 1240 nm), or blue-shifted from a wavelength of green light to a wavelength of blue light (having a peak wavelength of 380 to 495 nm).

Figure 2A:
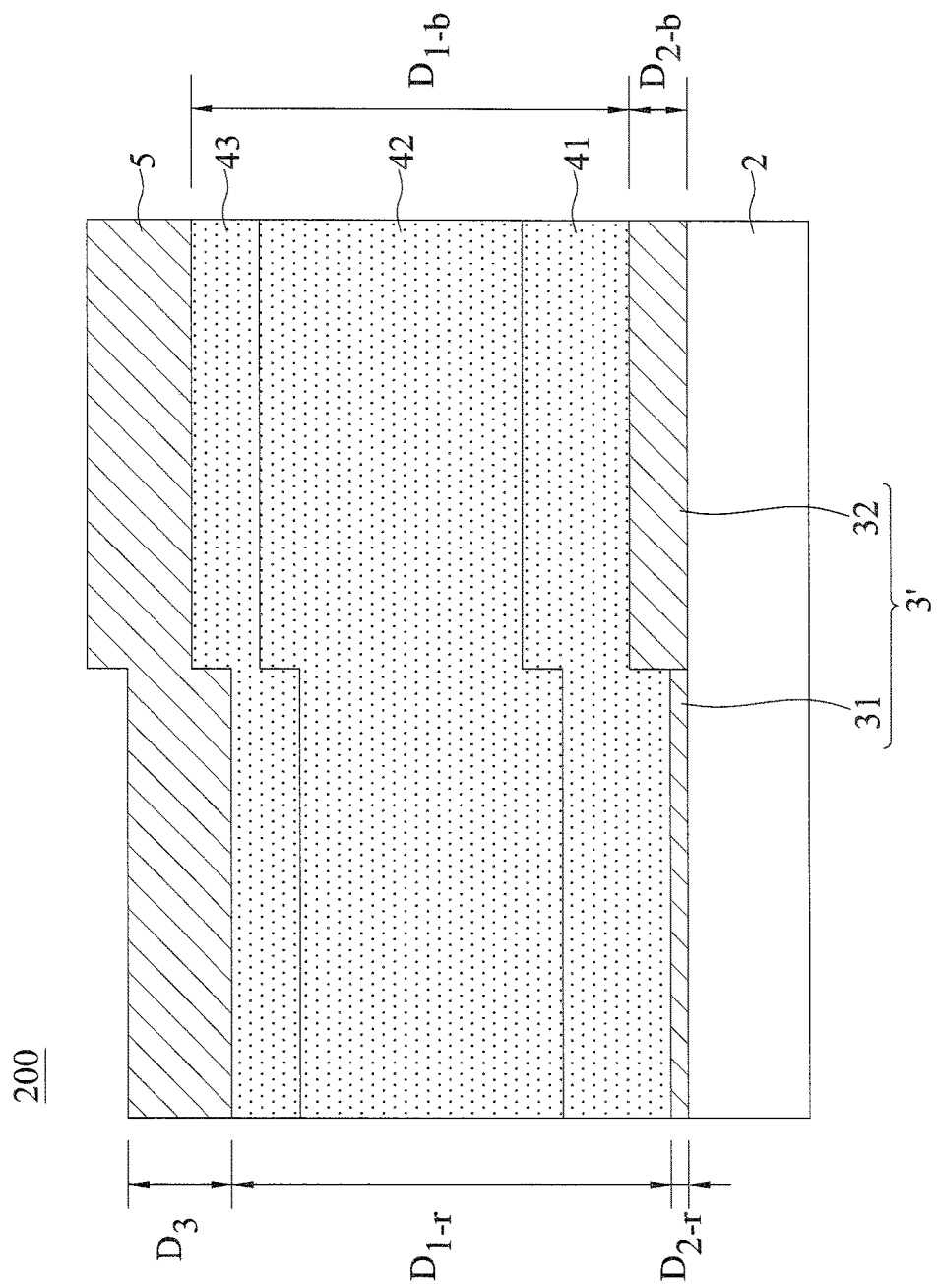
FIGS. 2A to 2C are schematic diagrams of a light emitting device according to a second embodiment of the present disclosure.
Figure 2B:
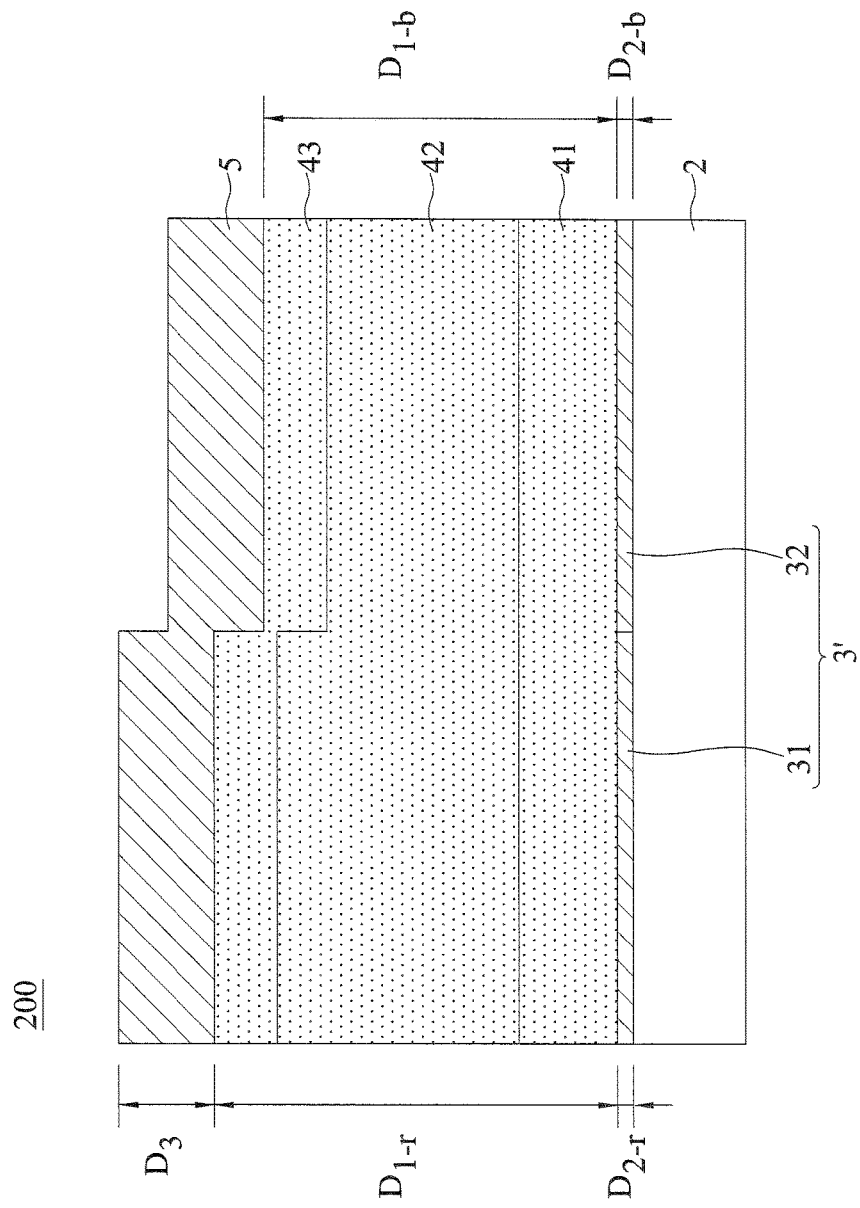
Figure 2C:
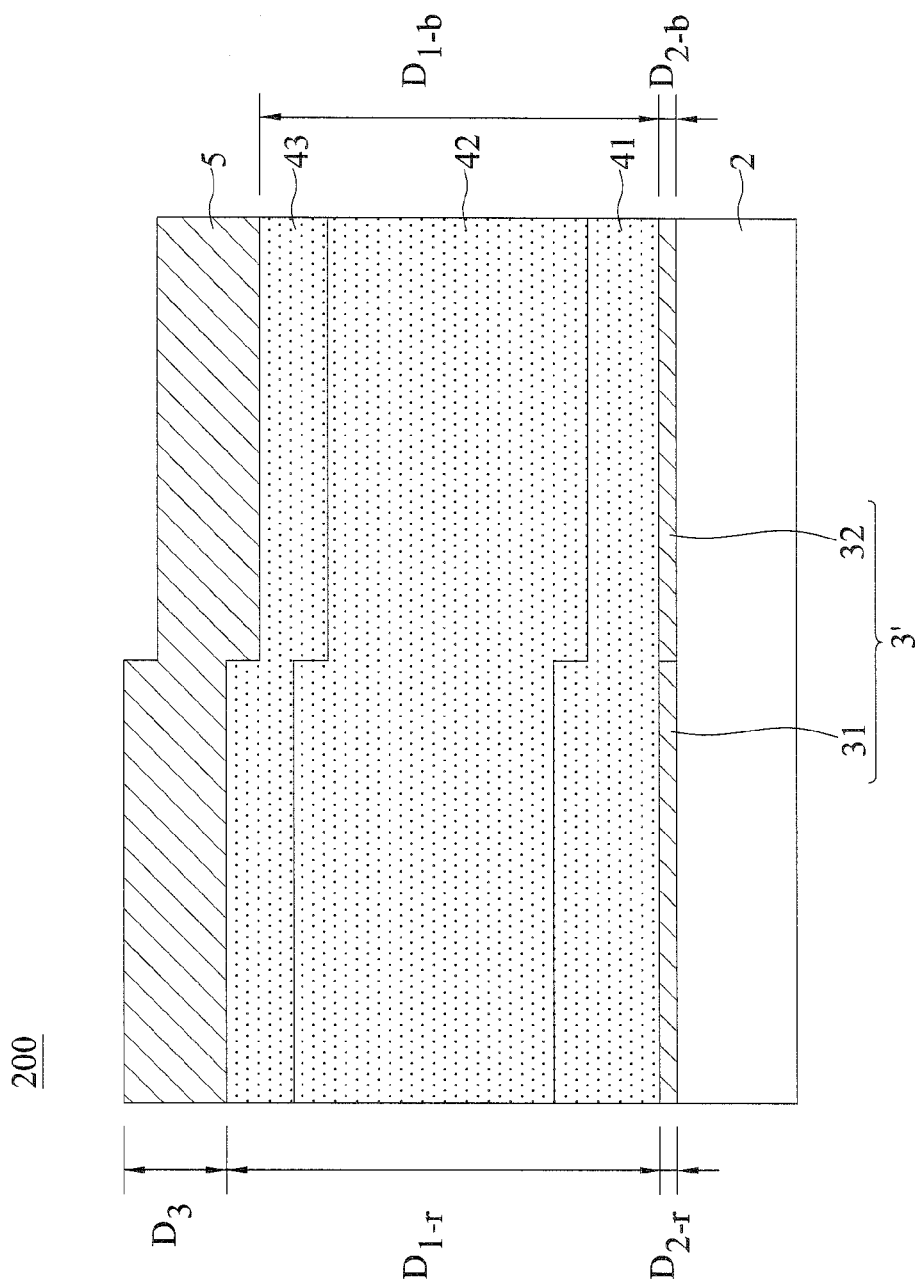

FIGS. 2A to 2C are schematic diagrams of a light emitting device 200 according to a second embodiment of the present disclosure. The light emitting device 200 of the second embodiment differs from the light emitting device 100 of the first embodiment in that the first metal layer 3' of the light emitting device 200 has a first metal portion 31 and a second metal portion 32 that cover the surface of the substrate layer 2. The organic material layer 42 includes a hole transport material and an electron transport material in contact with one another.

The thickness $D_{2-r}$ of the first metal portion 31 is adjusted between 5 and 20 nm and the distance $D_{1-r}$ between the first metal portion 31 and the second metal layer 5 is adjusted between 75 and 150 nm so as to cause the peak wavelength of the light emitted from the organic material layer 42 to shift from a first range to a second range (i.e., red shift or to a longer peak wavelength). The thickness $D_{2-b}$ of the second metal portion 32 is adjusted between 5 and 20 nm and the distance $D_{1-r}$ between the second metal portion 32 and the second metal layer 5 is adjusted between 75 nm and 150 nm so as to cause the peak wavelength of the light emitted from the organic material layer 42 to shift from the first range to a third range (i.e., blue shift or to a shorter peak wavelength). The thickness $D_{2-b}$ of the second metal portion 32 is greater than the thickness $D_{2-r}$ of the first metal portion 31, or the distance $D_{1-b}$ between the second metal portion 32 and the second metal layer 5 is less than the distance $D_{1-r}$ between the first metal portion 31 and the second metal layer 5. Therefore, the light emitting device 200 can emit light of two different wavelengths at the same time. Alternatively, one of the metal portion 31 and the second metal portion 32 can be replaced with an open portion (not shown), and the light emitting device 200 emits light that the exciplexes generate originally and red shifted or blue shifted light.

Further, the value of the second range can be changed by adjusting the thickness $D_{2-r}$ of the first metal portion 31 or the distance $D_{1-r}$ between the first metal portion 31 and the second metal layer 5. The value of the third range can be changed by adjusting the thickness $D_{2-b}$ of the second metal portion 32 or the distance $D_{1-b}$ between the second metal portion 32 and the second metal layer 5. Referring to FIG. 2A, the thickness $D_{2-r}$ of the first metal portion 31 is different from the thickness $D_{2-b}$ of the second metal portion 32. But the distance $D_{1-r}$ between the first metal portion 31 and the second metal layer 5 is equal to the distance $D_{1-b}$ between the second metal portion 32 and the second metal layer 5. That is, the total thickness of the carrier injection/transfer layer 41, the organic material layer 42 and the carrier injection/transfer layer 43 is uniform. The thickness $D_3$ of the second metal layer 5 is uniform. Referring to FIGS. 2B and 2C, the thickness $D_{2-r}$ of the first metal portion 31 is equal to the thickness $D_{2-b}$ of the second metal portion 32, but the distance $D_{1-r}$ between the first metal portion 31 and the second metal layer 5 is different from the distance $D_{1-b}$ between the second metal portion 32 and the second metal layer 5. Referring to FIG. 2B, the distance $D_{1-r}$ between the first metal portion 31 and the second metal layer 5 and the distance $D_{1-b}$ between the second metal portion 32 and the second metal layer 5 are adjusted through the organic material layer 42. The thickness of the carrier injection/transfer layer 41 is uniform, the thickness of the carrier injection/transfer layer 43 is uniform, and the thickness $D_3$ of the second metal layer 5 is uniform. Referring to FIG. 2C, the distance $D_{1-r}$ between the first metal portion 31 and the second metal layer 5 and the distance $D_{1-b}$ between the second metal portion 32 and the second metal layer 5 are adjusted through the carrier injection/transfer layer 41. The thickness of the organic material layer 42 is uniform, the thickness of the carrier injection/transfer layer 43 is uniform, and the thickness $D_3$ of the second metal layer 5 is uniform. In addition, the distance $D_{1-r}$ between the first metal portion 31 and the second metal layer 5 and the distance $D_{1-b}$ between the second metal portion 32 and the second metal layer 5 can be adjusted through the carrier injection/transfer layer 43.

Figure 3A:
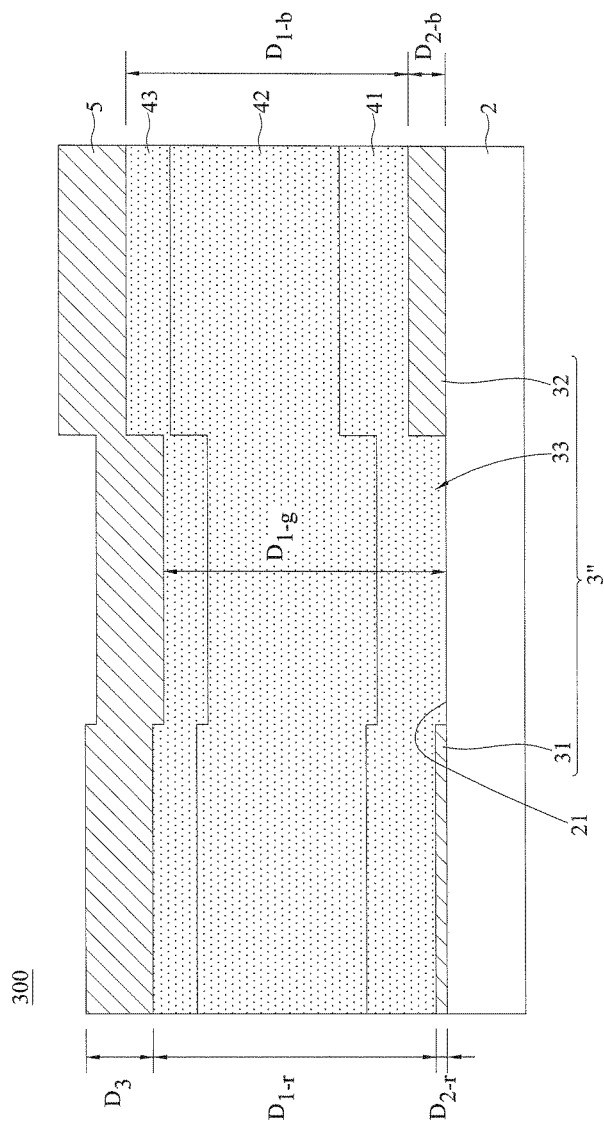
FIGS. 3A to 3C are schematic diagrams of a light emitting device according to a third embodiment of the present disclosure.
Figure 3B:
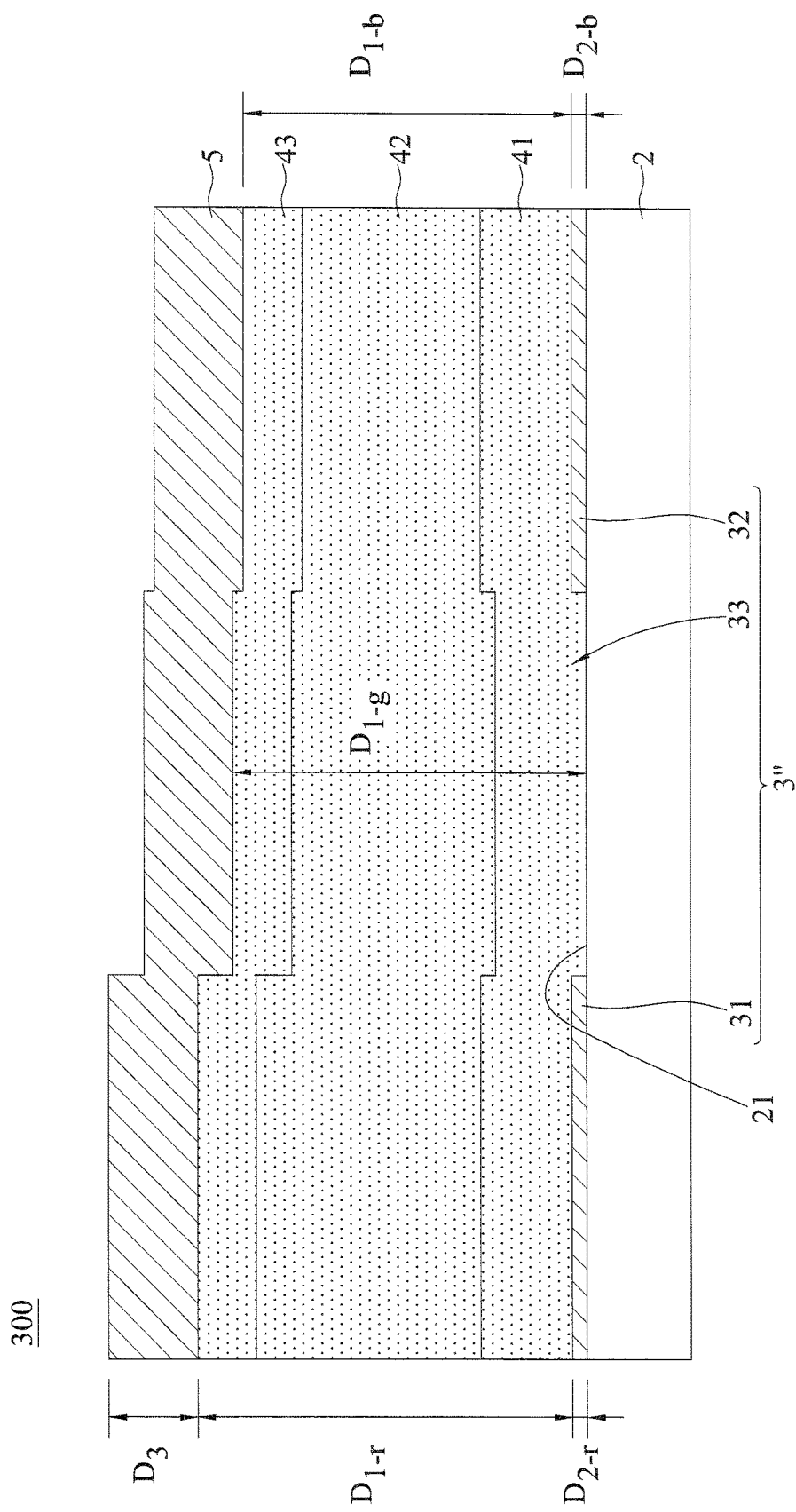
Figure 3C:
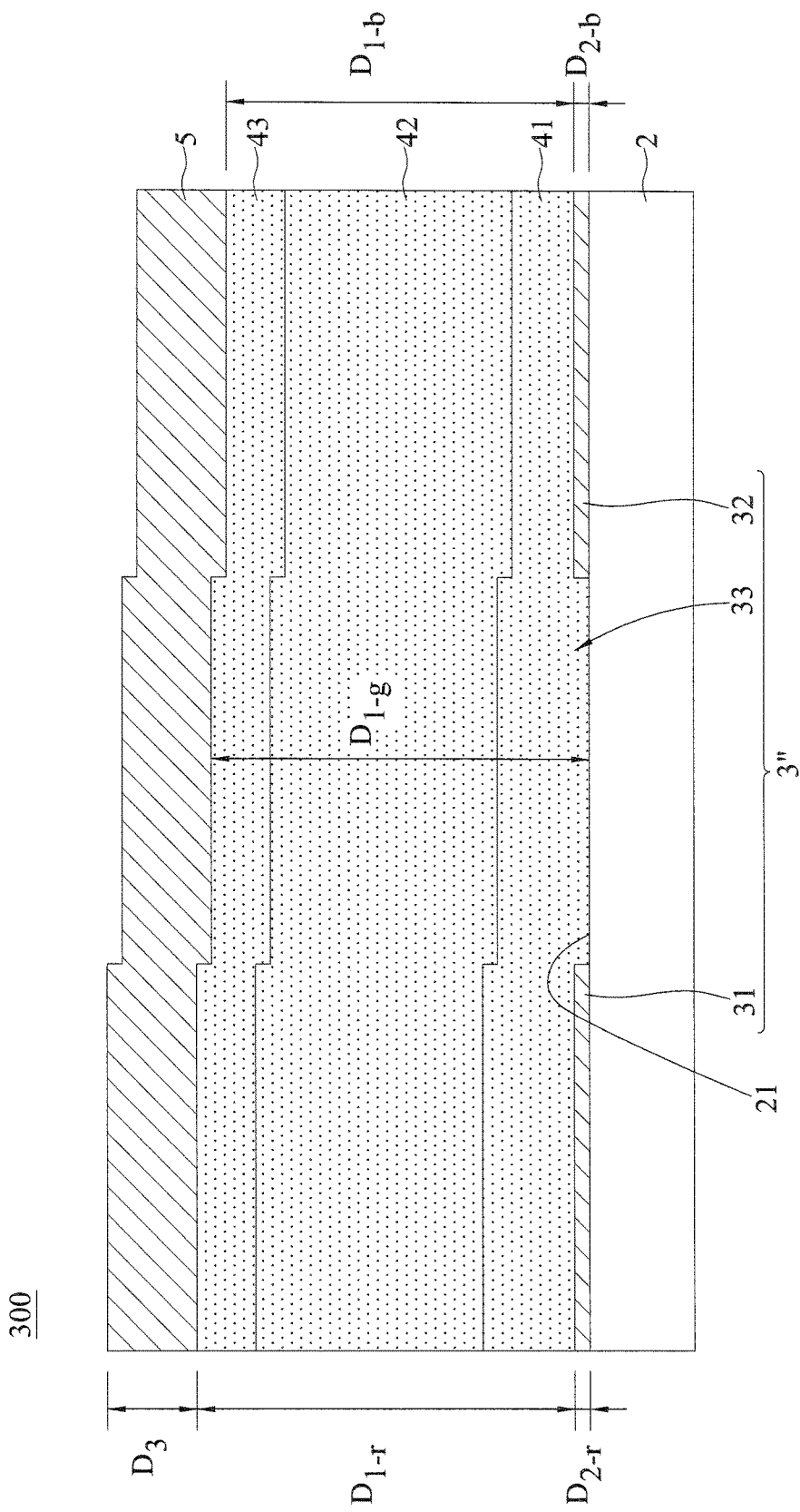

FIGS. 3A to 3C are schematic diagrams of a light emitting device 300 according to a third embodiment of the present disclosure. The light emitting device 300 of the third embodiment differs from the light emitting device 100 of the first embodiment in that the first metal layer 3" is a patterned or grid-shaped metal layer and has a first metal portion 31 and a second metal portion 32 formed on the surface 21 of the substrate layer 2 and an open portion 33 formed between the first metal portion 31 and the second portion 32 and exposing a portion of the surface 21 of the substrate layer 2. The organic material layer 42 includes a hole transport material and an electron transport material in contact with one another.

Through an interaction between the hole transport material and the electron transport material of the organic material layer 42, exciplexes are generated to emit light having a peak wavelength in a first range. Further, a first coupling (i.e., plasmon coupling) is generated between the first metal portion 31 and the second metal layer 5 to shift the peak wavelength of the light from the first range to a second range (for example, red shift or to a longer peak wavelength), and a second coupling is generated between the second metal portion 32 and the second metal layer 5 to shift the peak wavelength of the light from the first range to a third range (for example, blue shift or to a shorter peak wavelength).

It should be noted that the light is isotropic. When the second metal layer 5 has a reflective effect, the light having a peak wavelength in the first range can pass through the open portion 33 and leave the light emitting device 300, the light having a peak wavelength in the second range can pass through the first metal portion 31 and leave the light emitting device 300, and the light having a peak wavelength in the third range can pass through the second metal portion 32 and leave the light emitting device 300. If the second metal layer 5 is transparent, the light having peak wavelengths in the first, second and third ranges can pass through the second metal layer 5 and leave the light emitting device 300.

The value of the second range can be changed by adjusting the thickness $D_{2-r}$ of the first metal portion 31 or the distance $D_{1-r}$ between the first metal portion 31 and the second metal layer 5. The value of the third range can be changed by adjusting the thickness $D_{2-b}$ of the second metal portion 32 or the distance $D_{1-b}$ between the second metal portion 32 and the second metal layer 5. Referring to FIG. 3A, the thickness $D_{2-r}$ of the first metal portion 31 is different from the thickness $D_{2-b}$ of the second metal portion 32. But the distance $D_{1-r}$ between the first metal portion 31 and the second metal layer 5, the distance $D_{1-b}$ between the second metal portion 32 and the second metal layer 5, and the distance $D_{1-g}$ between the substrate layer 2 and the second metal layer 5 corresponding in position to the open portion 33 are equal. That is, the total thickness of the carrier injection/transfer layer 41, the organic material layer 42 and the carrier injection/transfer layer 43 is uniform. The thickness $D_3$ of the second metal layer 5 is uniform. Referring to FIGS. 3B and 3C, the thickness $D_{2-r}$ of the first metal portion 31 is equal to the thickness $D_{2-b}$ of the second metal portion 32, but the distance $D_{1-r}$ between the first metal portion 31 and the second metal layer 5 is different from the distance $D_{1-b}$ between the second metal portion 32 and the second metal layer 5. Referring to FIG. 3B, the distance $D_{1-r}$ between the first metal portion 31 and the second metal layer 5 and the distance $D_{1-b}$ between the second metal portion 32 and the second metal layer 5 are adjusted through the organic material layer 42. The thickness of the carrier injection/transfer layer 41 is uniform, the thickness of the carrier injection/transfer layer 43 is uniform, and the thickness $D_3$ of the second metal layer 5 is uniform. Referring to FIG. 3C, the distance $D_{1-r}$ between the first metal portion 31 and the second metal layer 5 and the distance $D_{1-b}$ between the second metal portion 32 and the second metal layer 5 are adjusted through the carrier injection/transfer layer 41. The thickness of the organic material layer 42 is uniform, the thickness of the carrier injection/transfer layer 43 is uniform, and the thickness $D_3$ of the second metal layer 5 is uniform. In addition, the distance $D_{1-r}$ between the first metal portion 31 and the second metal layer 5 and the distance $D_{1-b}$ between the second metal portion 32 and the second metal layer 5 can be adjusted through the carrier injection/transfer layer 43.

For example, the peak wavelength of light emitted from exciplexes is 495-570 nm (i.e., green light wavelength range). The thickness $D_{2-r}$ of the first metal portion 31 is about 5-29 nm. The distance $D_{1-r}$ between the first metal portion 31 and the second metal layer 5 is about 75-150 nm. A first coupling is thus generated between the first metal portion 31 and the second metal layer 5 to shift the peak wavelength of the light to 570-750 nm. The thickness $D_{2-b}$ of the second metal portion 32 is about 5-20 nm. The distance $D_{1-b}$ between the second metal portion 32 and the second metal layer 5 is 75-150 nm. The thickness $D_{2-b}$ of the second metal portion 32 is greater than the thickness $D_{2-r}$ of the first metal portion 31, or the distance $D_{1-b}$ between the second metal portion 32 and the second metal layer 5 is less than the distance $D_{1-r}$ between the first metal portion 31 and the second metal layer 5. A second coupling is thus generated between the second metal portion 32 and the second metal layer 5 to shift the peak wavelength of the light to 380-495 nm (i.e., blue light wavelength range). For another example, the peak wavelength of the light emitted by the exciplexes is 570-750 nm. The thickness $D_{2-r}$ of the first metal portion 31 is 5-20 nm. The distance $D_{1-r}$ between the first metal portion 31 and the second metal layer 5 is about 150-1000 nm. A first coupling is thus generated between the first metal portion 31 and the second metal layer 5 to shift the peak wavelength of the light to be less than 1240 nm. The thickness $D_{2-b}$ of the second metal portion 32 is 5-20 nm. The distance $D_{1-b}$ between the second metal portion 32 and the second metal layer 5 is about 30-75 nm. A second coupling is thus generated between the second metal portion 32 and the second metal layer 5 to shift the peak wavelength of the light to be greater than 305 nm. Therefore, the light emitting device 300 can emit light having three wavelength ranges, including red light, green light and blue light, which are mixed and form white light. The ratio of the green light, red light and blue light can be changed by adjusting the areas of the first metal portion 31 and the second metal portion 32 that cover the surface 21 of the substrate layer 2 and the area of the open portion 33 that exposes a portion of the surface 21 of the substrate layer 2.

Therefore, referring to FIGS. 1A to 1B, 2A to 2C and 3A to 3C, the light emitting device of the present disclosure has a substrate layer 2, a first metal layer 3 (or 3' or 3"), a carrier injection/transfer layer 41, an organic material layer 42 having a hole transfer material and an electron transfer material, a carrier injection/transfer layer 42 and a second metal layer 3 sequentially stacked on one another. The organic material layer includes a hole transport material and an electron transport material. The light emitting device of the present disclosure dispenses with the conventional light emitting layer. In an embodiment, the first metal layer 3 (or 3' or 3") has a uniform thickness and covers the surface of the electrode layer completely, as shown in FIGS. 1A and 1B, a light emitting device 100 thus formed emitting light having one wavelength segment, includes at lease two metal portions (i.e., the first metal portion 31 and the second metal portion 32, which are not spaced apart from each other) that have different thicknesses or are spaced from the second metal layer at different distances, as shown in FIGS. 2A-2C, or includes at least two metal portions (i.e., the first metal portion 31 and the second metal portion 32) and an open portion 33 that exposes a portion of the surfaces 21 of the substrate layer 2 among the metal portions, as shown in FIGS. 3A-3C, the light emitting device 300 thus formed emit light having three wavelength segments.

Figure 4:
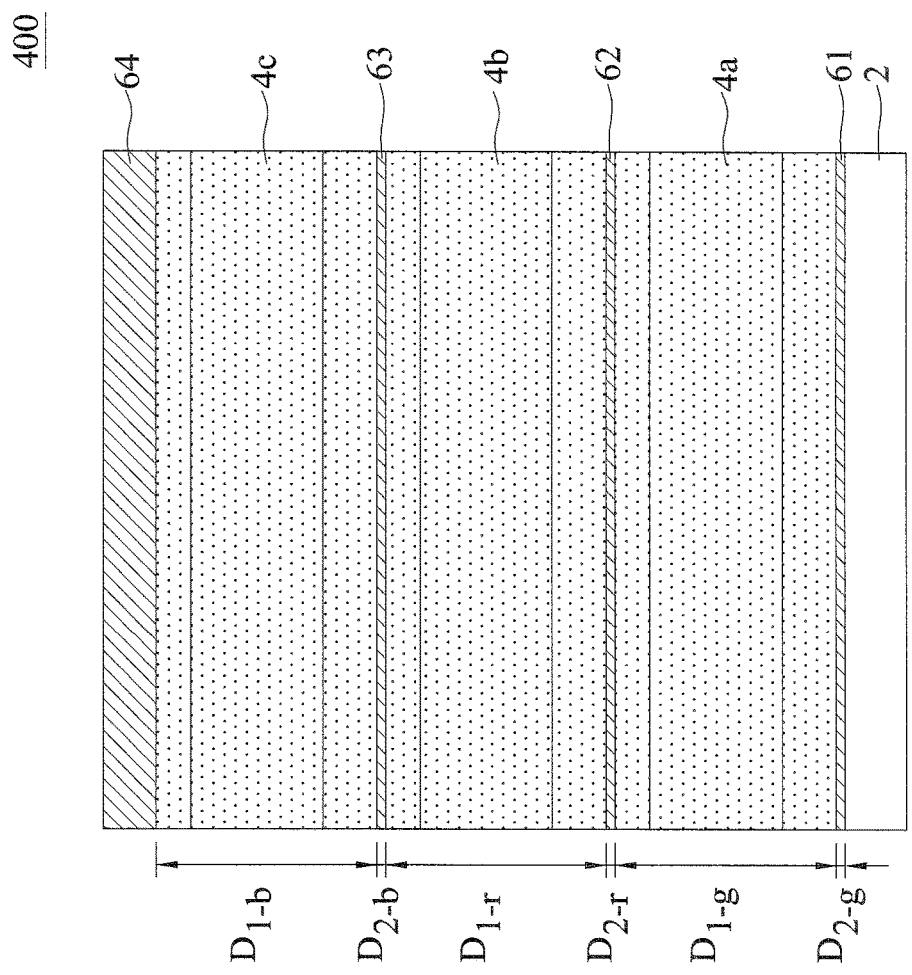
FIG. 4 is schematic diagram of a light emitting device according to a fourth embodiment of the present disclosure.

Referring to FIG. 4, a schematic diagram illustrating a light emitting device in accordance with a fourth embodiment of the present disclosure is shown. In this embodiment, a light emitting device 400 includes a substrate layer 2, a first metal layer 61, a first organic material layer 4a, a second metal layer 62, a second organic material layer 4b, a third metal layer 63, a third organic material layer 4c and a fourth metal layer 64 sequentially stacked.

The size and the material of the substrate layer 2 are the same as those of the substrate layer 2 in the first embodiment.

The sizes and the materials of the first metal layer 61, the second metal layer 62, and the third metal layer 63 are the same as those of the first metal layer 3 in the first embodiment. For example, the thickness may be between 5 nm and 20 nm, and the material may be metal (e.g. Al/LiF, Ag/Al/Ag, Ag/Ge/Ag) or nano metal oxide (e.g. BCP/$V_2O_5$, $MoO_3$, ZnS/Ag/ZnO/Ag, ZnPc/$C_{60}$). The sizes and the materials of the fourth metal layer 64 are the same as those of the second metal layer 5 described in the first embodiment. It is similarly used as the cathode. One of the substrate layer 2 and the first metal layer 61 can be used as an anode.

Each of the first organic material layer 4a, the second organic material layer 4b, and the third organic material layer 4c comprises a hole transport material and an electron transport material in contact with one another, which interacts with one another to generate exciplexes capable of emitting light having a peak wavelength in a first range. The first organic material layer 4a, the second organic material layer 4b, and the third organic material layer 4c are the same as the organic material layer 4 in the first embodiment, such as the green fluorescent material $Alq_3$.

The peak wavelengths of a first light emitted by the first organic material layer 4a, a second light emitted by the second organic material layer 4b, and a third light emitted by the third organic material layer 4c are all within a first range. The first metal layer 61 and the second metal layer 62 produces gain for the first light. A second coupling is generated between the second metal layer 62 and the third metal layer 63, such that the peak wavelength of the second light is shifted from the first range to a second range. A third coupling is generated between the third metal layer 63 and the fourth metal layer 64, such that the peak wavelength of the second light is shifted from the first range to a third range.

The gain of the first light can be changed by adjusting the thickness $D_{2-g}$ of the first metal layer 61, the thickness $D_{2-r}$ of the second metal layer 62, or the distance $D_{1-g}$ between the first metal layer 61 and the second metal layer 62. The second range can be changed by adjusting the thickness $D_{2-r}$ of the second metal layer 62, the thickness $D_{2-b}$ of the third metal layer 63, or the distance $D_{1-r}$ between the second metal layer 62 and the third metal layer 63. The third range can be changed by adjusting the thickness $D_{2-b}$ of the third metal layer 63, the thickness of the fourth metal layer 64, or the distance $D_{1-b}$ between the third metal layer 63 and the fourth metal layer 64.

For example, the peak wavelength of the first, second and third light is between 495-570 nm, wherein the wavelength band of the second light covers 495-750 nm, the wavelength band of the third light covers 380-570 nm. After a second coupling between the second metal layer 62 and the third metal layer 63 is generated, the thicknesses $D_{2-r}$ and $D_{2-b}$ of which are between 5-20 nm and which are spaced at a distance $D_{1-r}$ that is between 70-150 nm, the peak wavelength of the second light is shifted to 570-750 nm. After a third coupling between the third metal layer 63 and the fourth metal layer 64 is generated, which are spaced at a distance $D_{1-b}$ that is between 70-150 nm and less than $D_{1-r}$, the peak wavelength of the second light is shifted to 380-495 nm. For another example, the peak wavelength of the first, second and third light is between 570-750 nm, wherein the wavelength band of the second light covers 570-1240 nm, the wavelength band of the third light covers 305-750 nm. After a second coupling between the second metal layer 62 and the third metal layer 63 is generated, the thicknesses $D_{2-r}$ and $D_{2-b}$ of which are between 5-20 nm and which are spaced at a distance $D_{1-r}$ that is between 150-1000 nm, the peak wavelength of the second light is shifted to be less than 1240 nm. After a third coupling between the third metal layer 63 and the fourth metal layer 64 is generated, which are spaced at a distance $D_{1-b}$ that is between 30-75 nm and less than $D_{1-r}$, the peak wavelength of the second light is shifted to be greater than 305 nm. Therefore, the light emitting device 300 generates light that includes green red and blue bands, and emits white light constituted by the light of the three bands.

Table 1 to Table 12 show relationship between the peak wavelength of light emitted from exciplexes and the thicknesses of various layers.

In particular, Table 1 and Table 2 show differences between comparison examples that do not have the first metal layer (i.e., the thickness $D_2$ of the first metal layer is 0 nm) and experimental examples having the first metal layer. It should be noted that the second metal layer in the comparison examples 1 to 4 and the first metal layer and the second metal layer in the experimental examples 1 to 4 are made of Al. In the comparison examples 1 and 2 and the experimental example 1 and 2, the organic material layer is a composite layer of TAPC and B3PYMPM with a ratio of 1:1. In the comparison examples 3 and 4 and the experimental examples 3 and 4, the organic material layer has a layer of TAPC and a layer of B3PYMPM stacked in parallel. Further, in Table 1 to Table 12, $D_1$ represents the distance between the first metal layer and the second metal layer and can also represent $D_{1-r}$, $D_{1-b}$, and $D_2$ represents the thickness of the first metal layer and can also represent $D_{2-r}$, $D_{2-b}$.

TABLE 1

|  | $D_1$(nm) | $D_2$(nm) | Peak Wavelength(nm) | shift |
|---|---|---|---|---|
| Comparison example 1 | 100 | 0 | 520 | Before shift |
| Experimental example 1 | 100 | 15 | 497 | Blue shift |
| Comparison example 2 | 130 | 0 | 517 | Before shift |
| Experimental example 2 | 130 | 15 | 572 | Red shift |

Figure 5B:
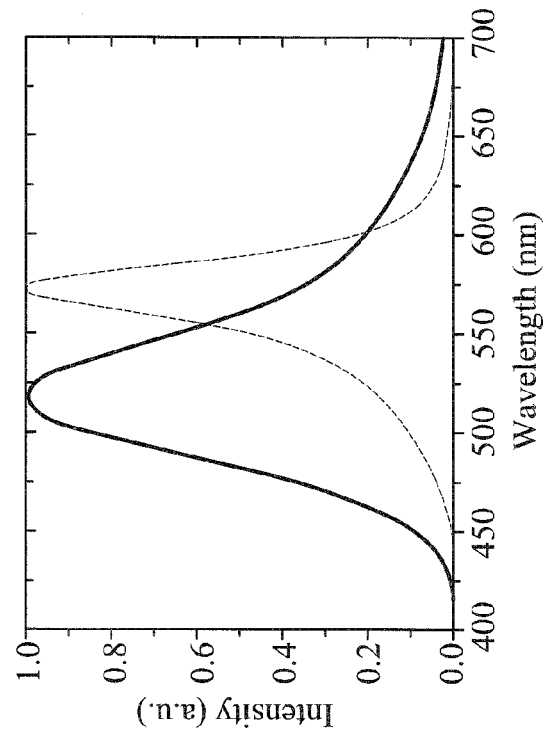
FIGS. 5A and 5B are red shift and blue shift diagrams of the light emitting device of FIG. 1A.
Figure 5A:
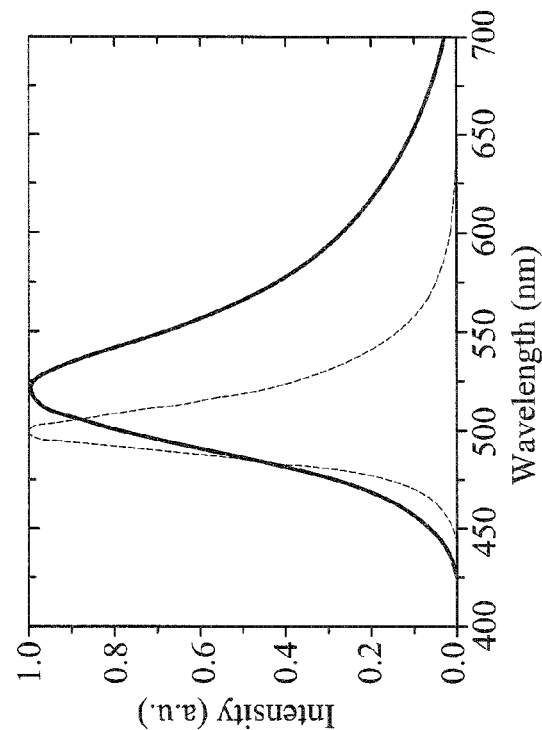

Referring to Table 1 and FIGS. 5A and 5B, in the comparison example 1, when the distance $D_1$ is 100 nm and the thickness $D_2$ of the first metal layer is 0 nm, the peak wavelength of the light is 520 nm, which is shown by a solid curve in FIG. 5A. Different from the comparison example 1, in the experimental example 1, the thickness $D_2$ of the first metal layer is 15 nm, and the peak wavelength of the light is blue-shifted to 497 nm, which is shown by a dotted curve in FIG. 5A. In the comparison example 2, when the distance $D_1$ is 130 nm and the thickness $D_2$ of the first metal layer is 0 nm, the peak wavelength of the light is 517 nm, which is shown by a solid curve in FIG. 5B. Different from the comparison example 2, in the experimental example 2, the thickness $D_2$ of the first metal layer is 15 nm, and the peak wavelength of the light is red-shifted to 572 nm, which is shown by a dotted curve in FIG. 5B.

TABLE 2

|  | D1(nm) | D2(nm) | Peak wavelength(nm) | shift |
|---|---|---|---|---|
| Comparison example 3 | 90 | 0 | 492 | Before shift |
| Experimental example 3 | 90 | 15 | 460 | Blue shift |
| Comparison example 4 | 130 | 0 | 506 | Before shift |
| Experimental example 4 | 130 | 15 | 569 | Red shift |

Figure 6A:
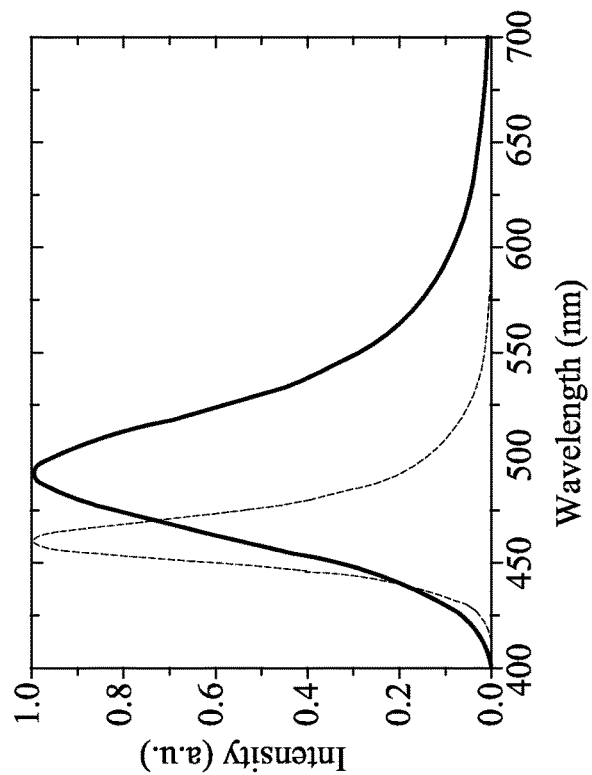
FIGS. 6A and 6B are red shift and blue shift diagrams of the light emitting device of FIG. 1B.
Figure 6B:
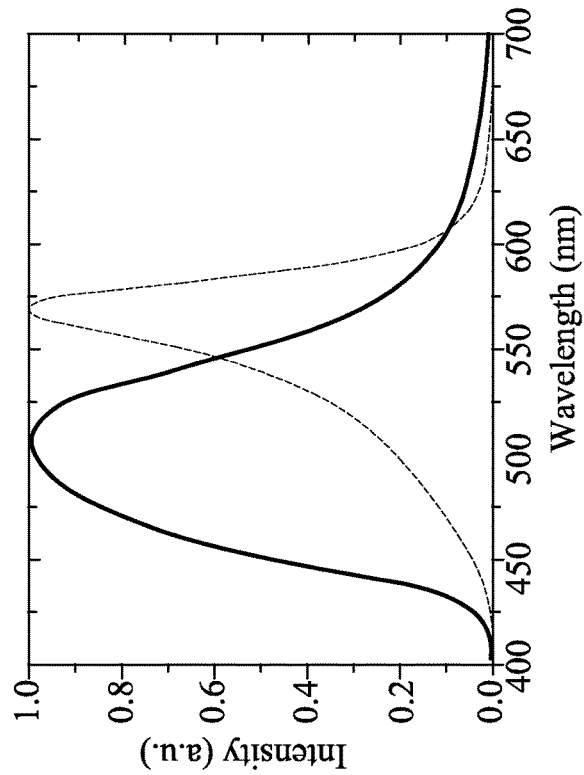

Referring to Table 2 and FIGS. 6A and 6B, in the comparison example 3, when the distance $D_1$ is 90 nm and the thickness $D_2$ of the first metal layer is 0 nm, the peak wavelength of the light is 492 nm, which is shown by a solid curve in FIG. 6A. Different from the comparison example 3, in the experimental example 3, the thickness $D_2$ of the first metal layer is 15 nm, and the peak wavelength of the light is blue-shifted to 460 nm, which is shown by a dotted curve in FIG. 6A. In the comparison example 4, when the distance $D_1$ is 130 nm and the thickness $D_2$ of the first metal layer is 0 nm, the peak wavelength of the light is 506 nm, which is shown by a solid curve in FIG. 6B. Different from the comparison example 4, in the experimental example 4, the thickness $D_2$ of the first metal layer is 15 nm, and the peak wavelength of the light is red-shifted to 569 nm, which is shown by a dotted curve in FIG. 6B.

Therefore, Tables 1 and 2 and FIGS. 5A-6B show that when the distance $D_1$ between the first metal layer and the second metal layer increases, the peak wavelength of the light is shifted toward a wavelength of red light, and when the distance $D_1$ between the first metal layer and the second metal layer decreases, the peak wavelength of the light is shifted toward a wavelength of blue light. Therefore, a coupling effect between the first metal layer and the second metal layer causes the light emitted from exciplexes to shift. If the peak wavelength of the light is in a first range (for example, a green light wavelength range of 495 to 570 nm) and the light covers the visible light range, the coupling effect causes the peak wavelength of the light to be red-shifted to a second range (for example, a red light wavelength range of 570 to 750 nm) or blue-shifted to a third range (for example, a blue light wavelength range of 380 to 495 nm).

Tables 3 to 12 show relationship between the peak wavelength of light and the thickness $D_2$ of the first metal layer and the distance $D_1$ between the first metal layer and the second metal layer (i.e., the total thickness of the carrier injection/transfer layer, the organic material layer and the carrier injection/transfer layer). In Tables 3 to 5, the electron transport material is PO-T2T and the hole transport material is TCTA, and exciplexes emit light having a peak wavelength of 530 nm. Further, the first metal layer and the second metal layer in Tables 3 to 5 are Al/Al layers, Ag/Ag layers and Au/Au layers, respectively. In Tables 6 to 9, exciplexes emit light having a peak wavelength of 630 nm, the electron transport material is PO-T2T and the hole transport material is NPNPB. Further, the first metal layer and the second metal layer in Tables 6 to 8 are Al/Al layers, Ag/Ag layers and Au/Au layers, respectively. Tables 6 to 8 show red shift simulation results when emitted light has a wavelength of 630 nm and the ratio of N (reflective coefficient) to K (extinction coefficient) is set to be 1.75. In tables 10-12, the exciplexes emit light having a peak wavelength of 570-750 nm, and the first and second metal layers are made of Al/Al, Ag/Ag or Au/Au.

TABLE 3

| | $D_1$(nm) | | | | | | | | | | | | | |
|---|---|---|---|---|---|---|---|---|---|---|---|---|---|---|
| $D_2$(nm) | 75 | 80 | 85 | 90 | 95 | 100 | 105 | 110 | 115 | 120 | 125 | 130 | 140 | 150 |
| 5 | 413 | 420 | 473 | 492 | 512 | 530 | 548 | 566 | 584 | 602 | 619 | 637 | 674 | 712 |
| 10 | 413 | 432 | 445 | 458 | 473 | 488 | 504 | 519 | 535 | 551 | 567 | 583 | 616 | 649 |
| 15 | 376 | 425 | 438 | 450 | 462 | 476 | 491 | 506 | 521 | 536 | 552 | 567 | 599 | 632 |
| 20 | 374 | 422 | 435 | 446 | 457 | 471 | 485 | 500 | 515 | 530 | 546 | 561 | 593 | 625 |

TABLE 4

| $D_2$(nm) | $D_1$(nm) | | | | | | | | | | | | | |
|---|---|---|---|---|---|---|---|---|---|---|---|---|---|---|
| | 75 | 80 | 85 | 90 | 95 | 100 | 105 | 110 | 115 | 120 | 125 | 130 | 140 | 150 |
| 10 | 462 | 492 | 513 | 531 | 544 | 567 | 594 | 621 | 629 | 645 | 658 | 673 | 711 | 740 |
| 15 | 466 | 484 | 502 | 517 | 533 | 547 | 565 | 582 | 600 | 616 | 632 | 647 | 678 | 711 |
| 20 | 463 | 478 | 493 | 508 | 523 | 538 | 553 | 568 | 584 | 600 | 616 | 632 | 662 | 693 |

TABLE 5

| $D_2$(nm) | $D_1$(nm) | | | | | | | | | | | | | |
|---|---|---|---|---|---|---|---|---|---|---|---|---|---|---|
| | 75 | 80 | 85 | 90 | 95 | 100 | 105 | 110 | 115 | 120 | 125 | 130 | 140 | 150 |
| 10 | 480 | 480 | 479 | 523 | 559 | 573 | 591 | 607 | 673 | 684 | 696 | 708 | 735 | 762 |
| 15 | 515 | 526 | 535 | 548 | 559 | 572 | 591 | 609 | 652 | 665 | 675 | 685 | 707 | 732 |
| 20 | 518 | 526 | 535 | 545 | 555 | 567 | 584 | 603 | 652 | 652 | 663 | 673 | 693 | 716 |

TABLE 6

| $D_2$(nm) | $D_1$(nm) | | | | | | | |
|---|---|---|---|---|---|---|---|---|
| | 150 | 200 | 250 | 300 | 350 | 400 | 450 | 500 |
| 5 | 816 | 1024 | >1200 | >1200 | 734 | 828 | 922 | 1006 |
| 10 | 740 | 915 | 1081 | >1200 | 708 | 790 | 873 | 957 |
| 15 | 711 | 872 | 1038 | >1200 | 693 | 773 | 854 | 936 |
| 20 | 693 | 853 | 1017 | 1182 | 684 | 764 | 845 | 926 |

TABLE 7

| $D_2$(nm) | $D_1$(nm) | | | | | | | |
|---|---|---|---|---|---|---|---|---|
| | 150 | 200 | 250 | 300 | 350 | 400 | 450 | 500 |
| 5 | 712 | 928 | 1158 | 606 | 691 | 785 | 886 | 968 |
| 10 | 649 | 880 | 1034 | 583 | 663 | 749 | 857 | 934 |
| 15 | 632 | 860 | 996 | 575 | 655 | 739 | 843 | 920 |
| 20 | 625 | 851 | 983 | 572 | 651 | 735 | 837 | 913 |

TABLE 8

| $D_2$(nm) | $D_1$(nm) | | | | | | | |
|---|---|---|---|---|---|---|---|---|
| | 150 | 200 | 250 | 300 | 350 | 400 | 450 | 500 |
| 5 | 850 | 1021 | 1189 | >1200 | 750 | 834 | 919 | 1004 |
| 10 | 762 | 914 | 1074 | >1200 | 721 | 796 | 875 | 956 |
| 15 | 732 | 876 | 1035 | 1195 | 707 | 779 | 856 | 936 |
| 20 | 716 | 856 | 1015 | 1175 | 699 | 770 | 847 | 926 |

TABLE 9

| $D_1$(nm) | Peak wavelength (nm) |
|---|---|
| 200 | 500 |
| 500 | 850 |
| 1000 | 1240 |

TABLE 10

| $D_2$(nm) | $D_1$(nm) | | | | | |
|---|---|---|---|---|---|---|
| | 30 | 40 | 50 | 60 | 70 | 75 |
| 5 | — | — | 325 | 365 | 400 | 413 |
| 10 | — | — | 311 | 341 | 371 | 413 |
| 15 | — | — | 305 | 333 | 359 | 376 |
| 20 | — | — | 303 | 330 | 355 | 374 |

TABLE 11

| $D_2$(nm) | $D_1$(nm) | | | | | |
|---|---|---|---|---|---|---|
| | 30 | 40 | 50 | 60 | 70 | 75 |
| 5 | 305 | 380 | 388 | 395 | 395 | 310 |
| 10 | 305 | 365 | 390 | 409 | 410 | 310 |
| 15 | 333 | 354 | 386 | 415 | 436 | 310 |
| 20 | 335 | 352 | 382 | 419 | 448 | 310 |

TABLE 12

| $D_2$(nm) | $D_1$(nm) | | | | | |
|---|---|---|---|---|---|---|
| | 30 | 40 | 50 | 60 | 70 | 75 |
| 5 | 0 | 365 | 400 | 405 | 465 | 400 |
| 10 | 428 | 441 | 456 | 472 | 480 | 410 |
| 15 | 450 | 463 | 478 | 491 | 506 | 515 |
| 20 | 460 | 473 | 485 | 497 | 511 | 518 |

As shown in Tables 3 to 5, the thickness $D_2$ of the first metal layer is adjusted between 5 and 20 nm, and the distance $D_1$ between the first metal layer and the second metal layer is adjusted between 75 and 150 nm. When the distance $D_1$ between the first metal layer and the second metal layer increases and the thickness $D_2$ of the first metal layer decreases, the peak wavelength of the light is shifted toward a red light wavelength. As such, red light is emitted. When the distance $D_1$ between the first metal layer and the second metal layer decreases and the thickness $D_2$ of the first metal layer increases, the peak wavelength of the light is shifted toward a blue light wavelength. As such, blue light is emitted.

As shown in Tables 6 to 9, the thickness $D_2$ can be adjusted between 5-20 nm, and the distance $D_1$ between the first metal layer and the second metal layer is adjusted between 150 and 500 nm. Further, when the distance $D_1$ reaches 1000 nm, the wavelength of the light is shifted from a red light wavelength range (570-750 nm) to a near infrared wavelength range less than 1240 nm. In particular, as shown in Table 9, when the distance $D_1$ between the first metal layer and the second metal layer is 200, 500 or 1000 nm, the light emitted from the light emitting device has a peak wavelength of 500, 850 or 1240 nm.

It is known from tables 10-12 that the thickness $D_2$ of the first metal layer can be adjusted between 5-20 nm, the distance $D_1$ between the first metal layer and the second layer can also be adjusted between 30-75 nm, and the light can be shifted from a red light wavelength range (570-750 nm) to a near a near ultraviolet light wavelength range greater than 305 nm.

Figure 7:
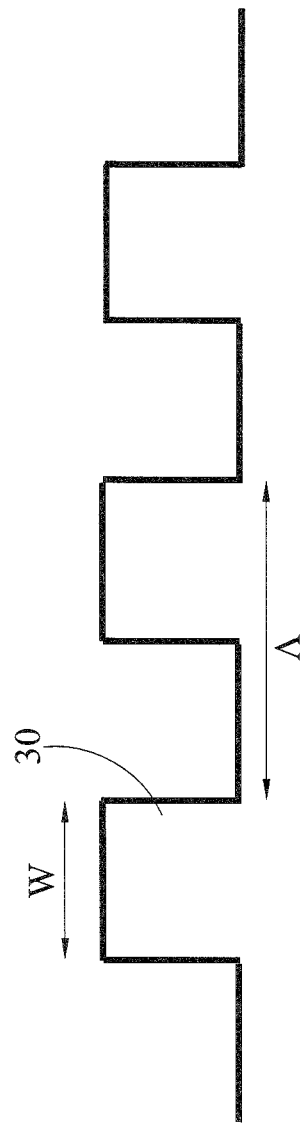
FIG. 7 is a schematic diagram of a periodic structure included in a light emitting device according to the present disclosure.

Referring to FIG. 7, the first metal portion 31 and the second metal portion 32 form a plurality of periodic structures, such that light having a peak wavelength within different ranges generates a gain. As shown in FIG. 7, the periodic structure has a size W between 40 nm and 437 nm and a period Λ between 50 nm and 965 nm. In other words, the widths of the first and second metal portions 31 and 32 are the width W of the periodic structure 30, and the period Λ of the periodic structure 30 is from end of the first metal portion to the end of the second metal portion 32. Please note that although the periodic structure shown in FIG. 7 is in the shape of a square wave, the periodic structure according to the present disclosure is not limited thereto. As a result, the light generated by the exciplexes, or the light that is red shifted or blue shifted due to the plasma coupling effects generates a gain through the periodic structure 30.

Tables 13-15 list the relations among the period Λ, size w and applied wavelength of the basic units of Al, Ag and Au.

TABLE 13

| | Wavelength (nm) | | | | | | | | | |
|---|---|---|---|---|---|---|---|---|---|---|
| | 340 | 400 | 450 | 500 | 550 | 600 | 650 | 700 | 750 | 800 |
| Period (nm) | 348 | 435 | 507 | 579 | 646 | 714 | 778 | 845 | 910 | 965 |
| Size (nm) | 170 | 208 | 237 | 268 | 298 | 327 | 345 | 383 | 411 | 437 |

TABLE 14

| | Wavelength (nm) | | | | | | | | | |
|---|---|---|---|---|---|---|---|---|---|---|
| | 380 | 400 | 450 | 500 | 550 | 600 | 650 | 700 | 750 | 800 |
| Period (nm) | 50 | 171 | 300 | 392 | 466 | 534 | 596 | 657 | 716 | 773 |
| Size (nm) | 40 | 124 | 189 | 229 | 267 | 300 | 334 | 365 | 398 | 429 |

TABLE 15

| | Wavelength (nm) | | | | | | | |
|---|---|---|---|---|---|---|---|---|
| | 510 | 525 | 550 | 600 | 650 | 700 | 750 | 800 |
| Period (nm) | 62 | 223 | 462 | 462 | 545 | 615 | 680 | 738 |
| Size (nm) | 45 | 157 | 209 | 260 | 299 | 326 | 356 | 382 |

Figure 8B:
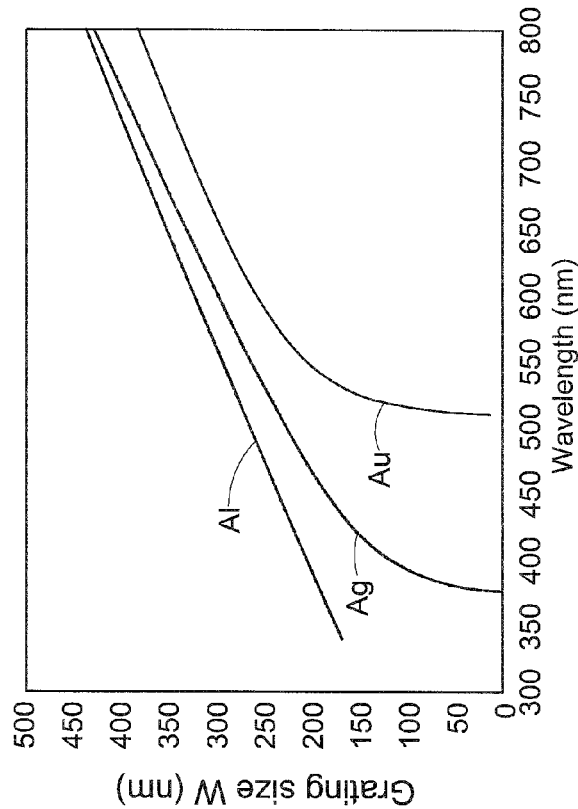
FIGS. 8A and 8B are relation curve diagrams of a periodic structure and applied wavelengths of a light emitting device according to the present disclosure.
Figure 8A:
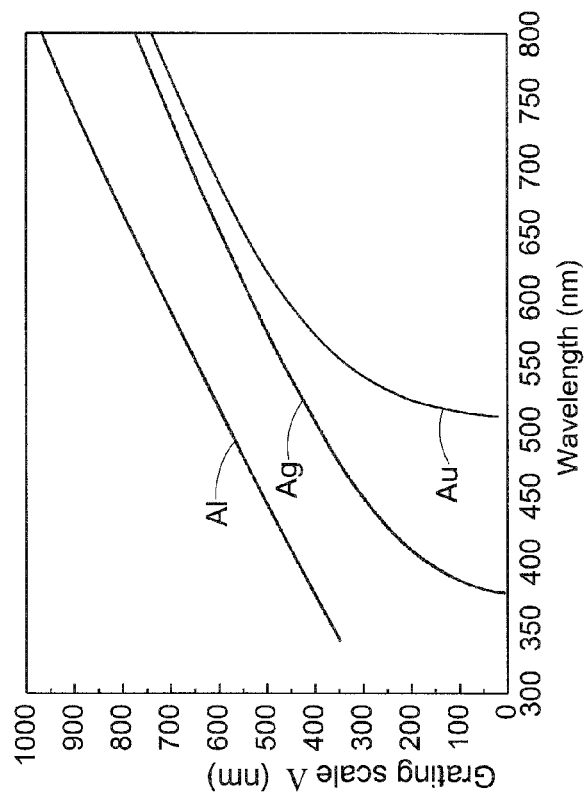

Refer to Tables 13-15 and FIGS. 8A and 8B. The curves from top to bottom shown in FIGS. 8A and 8B represent Al, Ag and AU, respectively. If the material is Al and the wavelength is 550 nm (green light), when the period Λ and the size W of the periodic structure are 646 nm and 298 nm, respectively, the light having a peak wavelength at 550 nm generates a gain. If the material is Ag and the wavelength is 450 nm (blue light), when the period Λ and the size W of the periodic structure are 300 nm and 189 nm, respectively, the light having a peak wavelength at 450 nm generates a gain. If the material is Au and the wavelength is 650 nm (red light), when the period Λ and the size W of the periodic structure are 545 nm and 299 nm, respectively, the light having a peak wavelength at 650 nm generates a gain. It can be seen from table 12 that Au is more suitable than Al and Ag for the gain of a long wavelength.

Figure 9A:
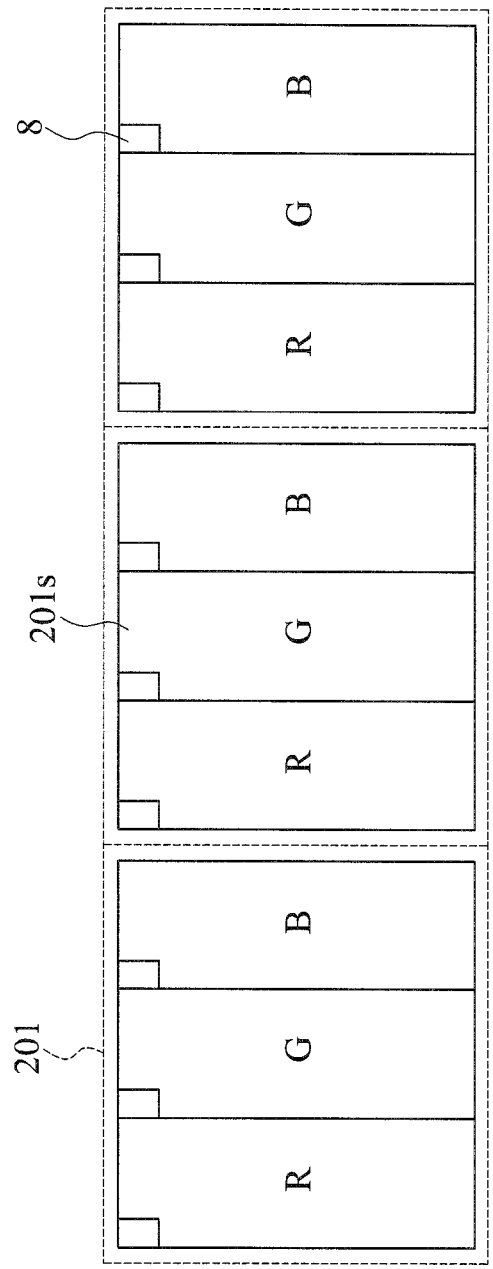
FIGS. 9A and 9b are schematic diagrams of an applied embodiment of a light emitting device according to the present disclosure.
Figure 9B:
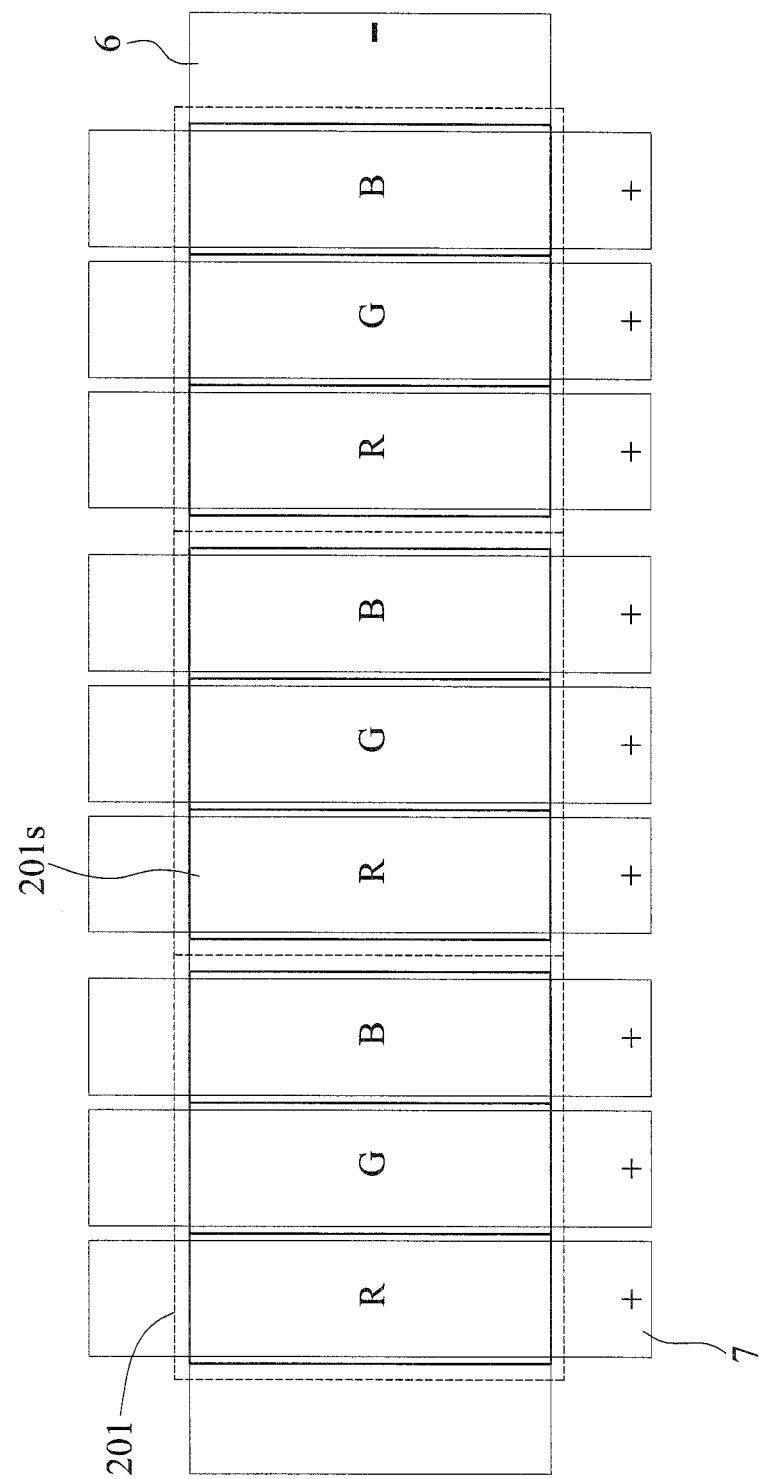

In an embodiment, the light emitting device 300 is applied to an active-matrix organic light-emitting diode (AMOLED) display or a passive-matrix organic light-emitting diode (PMOLED) display. Referring to FIG. 9A, the display of the light emitting device 300 in FIG. 9A acts as a pixel 201. The pixel 201 includes R, G and B sub-pixels 201s that are activated by thin film transistors (TFT) 8 and emit red, green and blue light, respectively. The TFT controls the current flowing through the R, G and B sub-pixels 201s and adjusts the color of each of the pixels 201. The AMOLED can thus display dynamic color grey-leveled images. Referring to FIG. 9B, FIG. 9B differs from FIG. 9A in that in FIG. 9B the PMOLED is activated and emit light by a cathode 6 and an anode 7.

Figure 10:
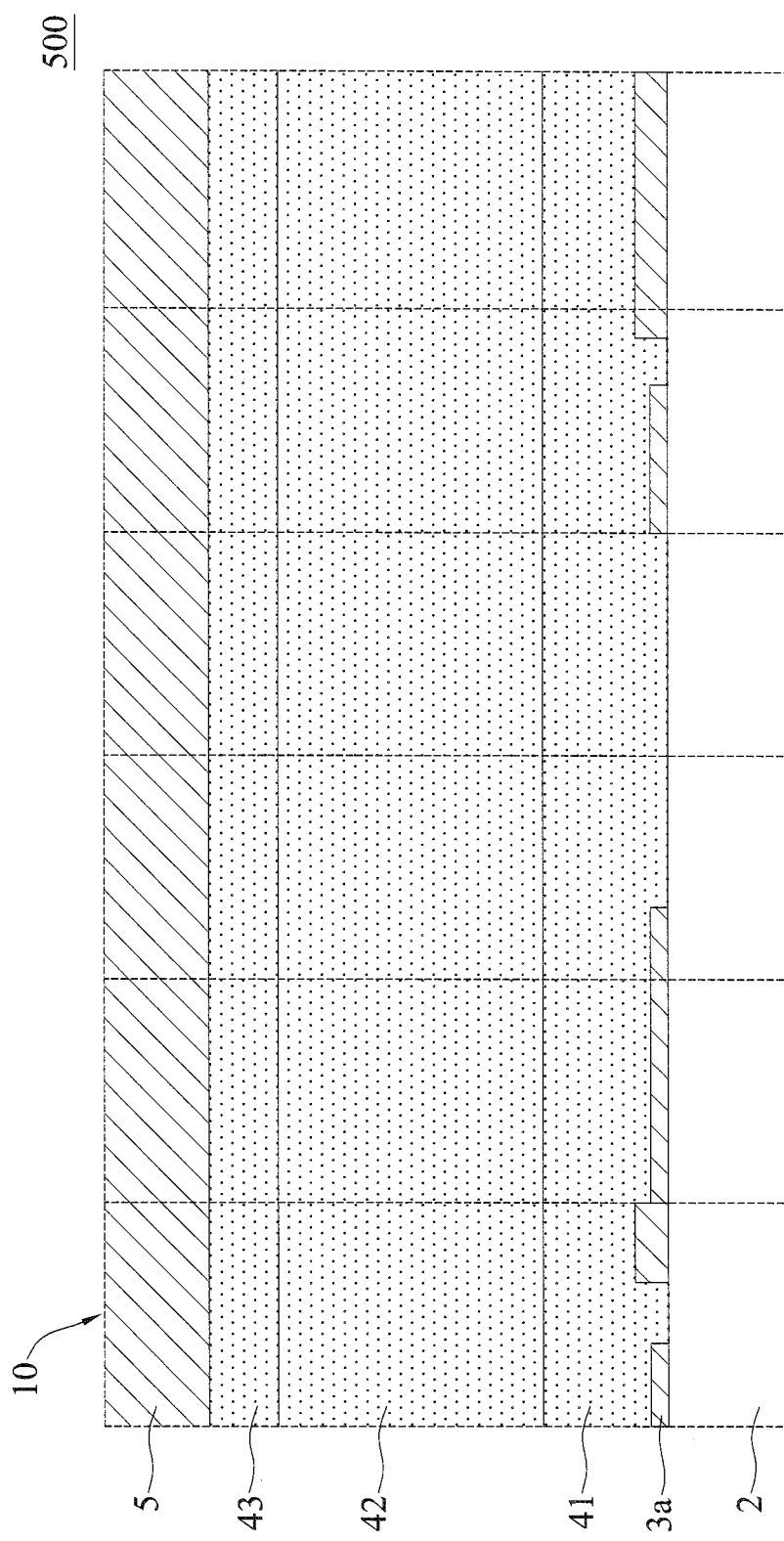
FIG. 10 is schematic diagrams of a light emitting device according to a fifth embodiment of the present disclosure.

In another embodiment, a light emitting device according to the present invention can be used as one of pixel of a display. In other words, each of the pixels includes a substrate layer, and a first metal layer, an organic material layer and a second metal layer stacked on the substrate layer sequentially, wherein the thickness of the first metal layer is zero, and the pixel emits light that is generated by the organic material layer; the thickness of the first metal layer uniformly covers the surface of the substrate layer completely, and the pixel emits light having one wavelength segment, i.e., red shifted or blue shifter light; the first metal layer includes a metal portion that covers a portion of the surface of the substrate layer and an opening portion that exposes a remaining portion of the surface of the substrate layer, and the pixel emits light having two wavelength segments, i.e., the light generated by the organic material layer and the red shifted or blue shifted light; the first metal layer includes at least two metal portions that cover the surface of the substrate layer, and the pixel emits light having two wavelength segments, i.e., the red shifted and blue shifted light; and the first metal layer includes at least two metal portions that cover the surface of the substrate layer and an open portion formed between the two metal portions, and the pixel emits light having three wavelength segments, i.e., the light generated by the organic material layer, the red shifted light, and the blue shifted light. Referring to FIG. 10, for example, a light emitting device 500 of the present disclosure includes a plurality of pixels 10. Each pixel 10 includes a substrate layer 2, a first metal layer 3a, a carrier injection/transfer layer 41, an organic material layer 42, a carrier injection/transfer layer 43, and a second metal layer 5 sequentially stacked. The substrate layer 2, the organic material layer 42, and the second metal layer 5 are the same as those in above embodiments. The first metal layer 3a may be one of the following: the first metal layer 3a has a uniform thickness and covers a surface of the substrate layer 2 completely (the second or sixth pixel from the life-hand-side of FIG. 10), a peak wavelength of the light is shifted from the first range to the second range by adjusting the thickness of the first metal layer 3a to be less or a distance between the first metal layer 3a and the second metal layer 5 to be greater, or the peak wavelength of the light is shifted from the first range to the third range by adjusting the thickness of the first metal layer 3a to be greater or a distance between the first metal layer 3a and the second metal layer 5 to be less; the first metal layer 3a has a metal portion that covers a portion of the surface of the substrate layer 2 and an open portion that exposes a remaining portion of the surface of the substrate layer 2 (e.g., the third pixel from the left-hand-side of FIG. 10), the peak wavelength of the light is shifted from the first range to the second range by adjusting the thickness of the metal portion to be less or a distance between the metal portion and the second metal layer 5 to be greater, or the peak wavelength of the light is shifted from the first range to the third range by adjusting the thickness of the metal portion to be greater or a distance between the metal portion and the second metal layer 5 to be less; the first metal layer 3a has a first metal portion and a second metal portion, the peak wavelength of the light is shifted from the first range to the second range by adjusting the thickness of the first metal portion to be less or a distance between the first metal portion and the second metal layer 5 to be greater, or the peak wavelength of the light is shifted from the first range to the third range by adjusting the thickness of the second metal portion to be greater or a distance between the second metal portion and the second metal layer 5 to be less; the first metal layer 3a has a first metal portion, a second metal portion, and an open portion formed between the first metal portion and the second metal portion (e.g., the first or fifth pixel from the left-hand-side of FIG. 10), the peak wavelength of the light is shifted from the first range to the second range by adjusting the thickness of the first metal portion to be less or a distance between the first metal portion and the second metal portion to be greater, or the peak wavelength of the light is shifted from the first range to the third range by adjusting the thickness of the first metal portion to be greater or a distance between the first metal portion and the second metal portion to be less; and the first metal layer 3a has zero thickness (e.g., the fourth pixel from the lift-hand-side of FIG. 10), and the original wavelength is not shifted.

Therefore, the light emitting device of the present disclosure does not include a light emitting layer. Instead, an interaction between the hole transport material and the electron transport material in contact with one another of the organic material layer generates exciplexes capable of emitting light, thereby reducing the fabrication cost and simplifying the fabrication process. Further, a coupling effect is generated between the first metal layer and the second metal layer on upper and lower sides of the organic material layer to cause a red or blue shift of the peak wavelength of the light emitted by the exciplexes. Therefore, the light emitting device of the present disclosure can emit blue light without the need of blue fluorescent/phosphorescent light-emitting guest materials, emit red light without the need of red fluorescent/phosphorescent light-emitting guest materials, or emit white light without the need of blue or red fluorescent/phosphorescent light-emitting guest materials.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A light emitting device, comprising:
   a substrate layer;
   a first metal layer formed on the substrate layer;
   a second metal layer formed above the first metal layer; and
   an organic material layer formed between the first metal layer and the second metal layer and comprising a hole transport material and an electron transport material in contact with one another;
   wherein an interaction between the hole transport material and the electron transport material generates exciplexes capable of emitting light having a peak wavelength in a first range, and a coupling is generated between the first metal layer and the second metal layer to shift the peak wavelength of the light, a distance between the first metal layer and the second metal layer or a thickness of the first metal layer being adjusted to shift the peak wavelength of the light to a second range or a third range,
   wherein the thickness of the first metal layer is between 5 and 20 nm, the distance between the first metal layer and the second metal layer is between 75 and 150 nm, the first range is between 376 and 708 nm, the second range is between 570 and 750 nm, and the third range is between 380 and 495 nm, and wherein when the thickness of the first metal layer decreases or the distance between the first metal layer and the second metal layer increases, the peak wavelength of the light is shifted from the first range to the second range, and when the thickness of the first metal layer increases or the distance between the first metal layer and the second metal layer decreases, the peak wavelength of the light is shifted from the first range to the third range, or,
   wherein the thickness of the first metal layer is between 5 and 20 nm, the distance between the first metal layer and the second metal layer is between 150 and 1000 nm, the first range is between 570 and 750 nm, and the second range is greater than the first range and less than 1240 nm.

2. The device of claim 1, wherein the first metal layer is formed on and completely covers a surface of the substrate layer.

3. The device of claim 1, wherein the thickness of the first metal layer is between 5 and 20 nm, the distance between the first metal layer and the second metal layer is between 30 and 75 nm, and the third range is less than the first range and greater than 305 nm.

4. The device of claim 3, wherein the thickness of the organic material layer is adjusted to adjust the distance between the first metal layer and the second metal layer.

5. The device of claim 1, wherein the first range is between 376 and 708 nm, the second range is between 570 and 750 nm, the third range is between 380 and 495 nm, and the first metal layer has a first metal portion and a second metal portion, wherein the thickness of the first metal portion is adjusted between 5 and 20 nm and the distance between the first metal portion and the second metal layer is adjusted between 75 and 150 nm so as to shift the peak wavelength of the light from the first range to the second range, the thickness of the second metal portion is adjusted between 5 and 20 nm and the distance between the second metal portion and the second metal layer is adjusted between 75 and 150 nm so as to shift the peak wavelength of the light from the first range to the third range, and the thickness of the second metal portion is greater than the thickness of the first metal portion, or a distance between the second metal portion and the second metal layer is less than a distance between the first metal portion and the second metal layer.

6. The device of claim 1, wherein the substrate layer is made of glass, plastic or conductive metal oxide.

7. The device of claim 1, wherein the organic material layer comprises a composite layer constituted by a combination of the hole transport material and the electron transport material.

8. The device of claim 1, wherein the organic material layer comprises a hole transport sublayer made of the hole transport material and an electron transport sublayer formed on and in contact with the hole transport sublayer and made of the electron transport material.

9. The device of claim 8, wherein the substrate layer or the first metal layer serves as an anode, the second metal layer serves as a cathode, the hole transport sublayer is adjacent to the first metal layer, and the electron transport sublayer is adjacent to the second metal layer.

10. The device of claim 1, wherein the substrate layer or the first metal layer serves as an anode, the second metal layer serves as a cathode, a carrier injection/transfer layer is formed between the first metal layer and the organic material layer, and a carrier injection/transfer layer is formed between the second metal layer and the organic material layer.

11. The device of claim 1, wherein the first metal layer and the second metal layer are made of metal or nano metal oxide.

12. A light emitting device, comprising:
a substrate layer having a surface;
a first metal layer formed on the surface of the substrate layer, wherein the first metal layer has a first metal portion, a second metal portion, and an open portion formed between the first metal portion and the second metal portion and exposing a portion of the surface of the substrate layer;
a second metal layer formed above the first metal layer; and
an organic material layer formed between the first metal layer and the second metal layer and covering the first metal portion, the second metal portion and the exposed portion of the surface of the substrate layer, wherein the organic material layer comprises a hole transport material and an electron transport material in contact with one another;
wherein an interaction between the hole transport material and the electron transport material generates exciplexes capable of emitting light having a peak wavelength in a first range, a first coupling is generated between the first metal portion and the second metal layer to shift the peak wavelength of the light from the first range to a second range, and a second coupling is generated between the second metal portion and the second metal layer to shift the peak wavelength of the light from the first range to a third range.

13. The device of claim 12, wherein the first range is between 376 and 708 nm, the second range is between 570 and 750 nm, and the third range is between 380 and 495 nm, wherein a thickness of the first metal portion is adjusted between 5 and 20 nm and a distance between the first metal portion and the second metal layer is adjusted between 75 and 150 nm so as to shift the peak wavelength of the light from the first range to the second range, a thickness of the second metal portion is adjusted between 5 and 20 nm and a distance between the second metal portion and the second metal layer is adjusted between 75 and 150 nm so as to shift the peak wavelength of the light from the first range to the third range, and the thickness of the second metal portion is greater than the thickness of the first metal portion or the distance between the second metal portion and the second metal layer is less than the distance between the first metal portion and the second metal layer.

14. The device of claim 12, wherein the first range is a wavelength range of green light, the second range is a wavelength range of red light, and the third range is a wavelength range of blue light, wherein when the light emitting device emits white light containing green, red and blue light, a ratio of the green, red and blue light is changed by adjusting a portion of the surface of the substrate layer covered by the first metal portion and the second metal portion and the portion of the surface of the substrate layer exposed from the open portion.

15. The device of claim 12, wherein the first range is between 570 and 750 nm, the second range is greater than the first range and less than 1240 nm, the third range is less than the first range and greater than 305 nm, a thickness of the first metal portion is adjusted between 5 and 20 nm, a distance between the first metal portion and the second metal layer is adjusted between 150 and 1000 nm, a thickness of the second metal portion is adjusted between 5 and 20 nm, and a distance between the second metal portion and the second metal layer is adjusted between 30 and 75 nm.

16. The device of claim 12, wherein the substrate layer is made of glass, plastic or conductive metal oxide.

17. The device of claim 12, wherein the organic material layer comprises a composite layer constituted by a combination of the hole transport material and the electron transport material.

18. The device of claim 12, wherein the organic material layer comprises a hole transport sublayer made of the hole transport material and an electron transport sublayer formed on and in contact with the hole transport sublayer and made of the electron transport material.

19. The device of claim 18, wherein the substrate layer or the first metal layer serves as an anode, the second metal layer serves as a cathode, the hole transport sublayer is adjacent to the first metal layer, and the electron transport sublayer is adjacent to the second metal layer.

20. The device of claim 12, wherein the substrate layer or the first metal layer serves as an anode, the second metal layer serves as a cathode, a carrier injection/transfer layer is formed between the first metal layer and the organic material layer, and a carrier injection/transfer layer is formed between the second metal layer and the organic material layer.

21. The device of claim 12, wherein the first metal layer and the second metal layer are made of metal or nano metal oxide, and the first metal layer is a patterned or grid-shaped metal layer.

22. The device of claim 12, wherein the first metal portion or the second metal portion constitutes a periodic structure such that light having a peak wavelength within the first range, the second range or the third range generates a gain, and the periodic structure has a size between 40 nm and 437 nm and a period between 50 nm and 865 nm.

23. A light emitting device, comprising:
a substrate layer;
a first metal layer formed on the substrate layer;
a second metal layer formed above the first metal layer;
a third metal layer formed above the second metal layer;
a fourth metal layer formed above the third metal layer;
a first organic material layer formed between the first metal layer and the second metal layer;
a second organic material layer formed between the second metal layer and the third metal layer; and
a third organic material layer formed between the third metal layer and the fourth metal layer;
wherein each of the first organic material layer, the second organic material layer and the third organic material layer comprises a hole transport material and an electron transport material in contact with one another, the hole transport material and the electron transport material interact with one another to generate exciplexes capable of emitting light having a peak wavelength in a first range, and first light emitted by the first organic material, second light emitted by the second organic material and third light emitted by the third organic material have their peak wavelengths within the first range, a second coupling is generated between the second metal layer and the third metal layer and shifts the peak wavelength of the second light from the first range to a second range, and a third coupling is generated between the third metal layer and the fourth metal layer and shifts the peak wavelength of the third light from the first range to a third range,
wherein the first range is between 376 and 708 nm, the second range is between 570 to 750 nm, the third range is between 380 and 495 nm, thicknesses of the second metal layer and the third metal layer are between 5 and 20 nm, and a distance between the second metal layer and the third metal layer is between 75 and 150 nm, a distance between the third metal layer and the fourth metal layer is between 75 and 150 nm and less than the distance between the second metal layer and the third metal layer, or,
wherein the first range is between 570 and 750 nm, the second range is greater than the first range and less than 1240 nm, the third range is less than the first range and greater than 305 nm, the thicknesses of the second metal layer and the third metal layer are between 5 and 20 nm, a distance between the second metal layer and the third metal layer is between 150 and 1000 nm, and a distance between the third metal layer and the fourth metal layer is between 30 and 75 nm.

24. The device of claim 23, wherein the second range is changed by adjusting a thickness of the second metal layer, a thickness of the third metal layer, or a distance between the second metal layer and the third metal layer, and the third range is changed by adjusting a thickness of the third metal layer, a thickness of the fourth metal layer, or a distance between the third metal layer and the fourth metal layer.

25. The device of claim 23, wherein the substrate layer or the first metal layer is an anode, and the fourth metal layer is a cathode.

26. The device of claim 23, wherein the first metal layer, the second metal layer, the third metal layer, or the fourth metal layer is made of metal or nano metal oxide.

27. The device of claim 23, wherein each of the first organic material layer, the second organic material layer and the third organic material layer comprises a composite layer constituted by a combination of the hole transport material and the electron transport material.

28. The device of claim 23, wherein each of the first organic material layer, the second organic material layer and the third organic material layer comprises a hole transport sublayer made of the hole transport material and an electron transport sublayer formed on and in contact with the hole transport sublayer and made of the electron transport material.

29. A light emitting device having a plurality of pixels, each of the pixels comprising:
a substrate layer having a surface;
a first metal layer formed on the substrate layer;
a second metal layer formed above the first metal layer; and
an organic material layer formed between the first metal layer and the second metal layer and having a hole transport material and an electron transport material in contact with one another, the hole transport material interacting with the electron transport material to generate exciplexes that emit light having a peak wavelength within a first range, the first metal layer coupling with the second metal layer that is spaced apart from the first metal layer by the organic material layer to shift the peak wavelength,
wherein each of the pixels further has one of the following:
the first metal layer covers the surface of the substrate layer completely, the peak wavelength of the light is shifted from the first range to the second range by adjusting a thickness of the first metal layer to be less or a distance between the first metal layer and the second metal layer to be greater, or the peak wavelength of the light is shifted from the first range to the second range by adjusting the thickness of the first metal layer to be greater or a distance between the first metal layer and the second metal layer to be less;
the first metal layer has a metal portion that covers a portion of the surface of the substrate layer and an open portion that exposes a remaining portion of the surface of the substrate layer, the peak wavelength of the light is shifted from the first range to the second range by adjusting a thickness of the metal portion to be less or a distance between the metal portion and the second metal layer to be greater, or the peak wavelength of the light is shifted from the first range to the third range by adjusting the thickness of the metal portion to be greater or the distance between the metal portion and the second metal layer to be less;
the first metal layer has a first metal portion and a second metal portion that cover the surface, the peak wavelength of the light is shifted from the first range to the second range by adjusting the thickness of the first metal portion to be less or a distance between the first metal portion and the second metal layer to be greater, or the peak wavelength of the light is shifted from the first range to the third range by adjusting the thickness of the second metal portion to be greater or the distance between the second metal portion and the second metal layer to be less; and the first metal layer has a first metal portion, a second metal portion, and an open portion formed between the first metal portion and the second metal portion, the peak wavelength of the light is shifted from the first range to the second range by adjusting the thickness of the first metal portion to be less or the distance between the first metal portion and the second metal layer to be greater, or the peak wavelength of the light is shifted from the first range to the third range by adjusting the thickness of the second metal portion to be greater or the distance between the second metal portion and the second metal layer to be less, wherein the first range is between 376 and 708 nm, the second range is between 570 and 750 nm, the third range is between 380 and 495 nm, the first metal layer, the first metal portion and the second metal portion have the thicknesses that are adjusted between 5 and 20 nm, and the distances between the first metal layer and the second metal layer, between the first metal portion and the second metal layer, and between the second metal portion and the second metal layer are adjusted between 75 and 150 nm, or wherein the first range is between 570 and 750 nm, the second range is greater than the first range and less than 1240 nm, the third range is less than the first range and greater than 305 nm, the thickness of the first metal portion is adjusted between 5 and 20 nm, the distance between the first metal portion and the second metal layer is adjusted between 150 and 1000 nm, the thickness of the second metal portion is adjusted between 5 and 20 nm, and the distance between the second metal portion and the second metal layer is adjusted between 30 and 75 nm.

30. The device of claim 29, wherein the organic material layer includes a mixing layer that has the hole transport material and the electron transport material that is mixed with the hole transport material.

31. The device of claim 29, wherein the organic material layer includes a hole transport sublayer that is constituted by the hole transport material and an electron transport sublayer that is in contact with and disposed on the hole transport sublayer and constituted by the electron transport sublayer.

32. The device of claim 29, wherein the substrate layer is made of glass, plastic or conductive metal oxide.

33. The device of claim 29, wherein the light emitting device is a passive-matrix organic light emitting diodes, or an active-matrix organic light emitting diodes.

* * * * *